(12) United States Patent
Kitano

(10) Patent No.: US 7,698,675 B2
(45) Date of Patent: Apr. 13, 2010

(54) METHOD AND DESIGN SYSTEM FOR SEMICONDUCTOR INTEGRATED CIRCUIT WITH A REDUCED PLACEMENT AREA

(75) Inventor: Tomohiro Kitano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 448 days.

(21) Appl. No.: 11/581,756

(22) Filed: Oct. 17, 2006

(65) Prior Publication Data

US 2007/0089083 A1    Apr. 19, 2007

(30) Foreign Application Priority Data

Oct. 18, 2005    (JP) .............................. 2005-302872

(51) Int. Cl.
*G06F 17/50* (2006.01)
(52) U.S. Cl. .................... 716/7; 716/8; 716/11
(58) Field of Classification Search ............. 716/2, 716/7–14
See application file for complete search history.

(56) References Cited

U.S. PATENT DOCUMENTS 6,260,177 B1 * 7/2001 Lee et al. ..................... 716/2
6,301,692 B1 * 10/2001 Kumashiro et al. ........... 716/10
2004/0168143 A1 8/2004 Kishibe
2006/0190893 A1 * 8/2006 Morton ......................... 716/10

FOREIGN PATENT DOCUMENTS

| JP | 1-239871 A | 9/1989 |
|---|---|---|
| JP | 4-144153 A | 5/1992 |
| JP | 2001-351981 A | 12/2001 |
| JP | 2004-252717 A | 9/2004 |

* cited by examiner

*Primary Examiner*—Vuthe Siek
(74) *Attorney, Agent, or Firm*—Foley & Lardner LLP

(57) ABSTRACT

A standard cell is split into a plurality of regions, and shareability information having pin information is added to a cell library for each of the split regions. Through comparison of shareability information, a determination is made as to whether, at the time of automatic placement, a standard cell can be placed so as to share part of its region with a standard cell placed adjacent to that standard cell. On the basis of the determination result, when placing a standard cell, a standard cell to be placed adjacent to that standard cell is placed so as to share part of its region, thereby making it possible to reduce the placement area.

12 Claims, 20 Drawing Sheets

1001 1002
(701) (702)

1201 (701)    1202 (702)

METHOD AND DESIGN SYSTEM FOR SEMICONDUCTOR INTEGRATED CIRCUIT WITH A REDUCED PLACEMENT AREA

This application claims priority to prior application JP 2005-302872, the disclosure of which is incorporated herein by reference.

BACKGROUND OF THE INVENTION

The present invention relates to a design method and design system for a semiconductor integrated circuit using standard cells. More specifically, the present invention relates to a design method and design system for a semiconductor integrated circuit which can reduce a device placement area through sharing of part of standard cell regions.

In recent years, automatic placement and automatic wiring using standard cells have been performed in the layout design of semiconductor integrated circuits in order to achieve efficient layout design. In a design method using standard cells, cells are automatically placed using a computer, which proves advantageous since a design can be executed in a short time. However, in conventional automatic design methods using standard cells, the cells are simply laid out in such a manner that there are no overlapping standard cells, and this leads to the problem of increased device placement area. In a semiconductor integrated circuit process, it is necessary to execute a design in a short time, and also make the device placement area small. Therefore, the major challenge for the conventional design methods using standard cells is to achieve a reduction in device placement area.

A conventional automatic design method using standard cells will now be described. It is assumed that a circuit as shown in FIG. 7, for example, is designed using standard cells. Circuit information of a standard cell contains information on the constituent circuits and their connections. Circuit information 701 and 702 each represent an inverter, and circuit information 703 represents a transfer gate. Circuit information 704 to 713 are information on their connections. In the following description, these circuit information will be represented as, for example, the inverter 701 and the transfer gate 703 for the simplicity of description.

In a design method using standard cells, an individual standard cell is prepared in advance with respect to each of basic circuits (also referred to as "cells"). An inverter and a transfer gate are prepared as the basic circuits constituting the circuit shown in FIG. 7. These inverter and transfer gate are represented as an inverter 301 and a transfer gate 302 in FIG. 3. FIG. 4 shows standard cells 401 and 403 corresponding to the inverter 301 and the transfer gate 302, respectively.

The standard cells prepared in this way are placed in accordance with the circuit information of FIG. 7. As shown in FIG. 8, the inverter 701, the inverter 702, and the transfer gate 703 are placed as standard cells 801, 802, and 803, respectively. In this case, the device placement area is at least equal to the sum total of the areas of the placed standard cells, and cannot be reduced any further. Since the resulting device placement area is large as described above, contrivances have been made to reduce the device placement area. Examples of related art techniques aimed at reducing the device placement area include those described in the patent documents below.

Japanese Unexamined Patent Application Publication No. 2001-351981 (which is referred to as patent document 1) discloses a technique according to which, with the edge portion of a standard cell being an electric potential system that does not fluctuate, such as a power supply voltage (VDD, VSS), this is constituted by a source (diffusion layer), and a cell designed in a given configuration is used. When such standard cells are placed, and the edge portions of adjacent standard cells are identical, the edge portions of the adjacent standard cells are shared with each other. That is, under the restricted condition with the edge portion of a standard cell being a power supply voltage system (VDD, VSS), the cells are placed after deleting the redundant edge portions, thereby reducing the device placement area. Further, according to the technique described in the patent document 1, the determination as to whether the cells can be placed while deleting their redundant portions is made solely on the basis of information on the configuration of the edge portions of standard cells, and there is no mechanism provided for electric potential checking. Accordingly, the range of applicable standard cell configurations is limited, making the application of the technique to most standard cells difficult.

For example, referring to FIG. 18, a total of five kinds of standard cells are considered here, including standard cells 1801, 1802, and 1803 used in an embodiment of the present invention that will be described later, and standard cells 1804 and 1805 of a unique structure suited to the technique described in the patent document 1. The standard cells 1801 to 1803 are of a cell structure that takes into consideration the fact that wire connection can be smoothly performed during the process of automatic wiring after the placement of cells by ensuring that a wiring pattern be always inserted in the port (terminal) portion of a cell as indicated at 1806. On the other hand, with the standard cells 1804 and 1805, automatic wiring after the placement of cells is difficult because no wiring pattern exists in the port portion of the cells.

It is assumed that, on the basis of the above, the technique described in the patent document 1 is applied to all of these standard cells. In this case, there is the possibility of a reduction in area due to the deletion of redundant portions only in the case where the edge portion of a cell consists solely of a source (diffusion layer) with a completely fixed potential, as in the region of the standard cell 1804 indicated at 1808. In all of the other standard cells, however, at least one region where the potential fluctuates, that is, a pattern having a potential other than the source, is included in the edge portion, as indicated at 1806 in the standard cell 1801, for example. Therefore, the device placement area is not reduced at all even when the technique according to the patent document 1 is applied.

Patent document 2 (Japanese Unexamined Patent Application Publication No. 2004-252717) discloses providing a high-speed cell having a first cell region, and a low-leak cell having a second region obtained by enlarging the high-speed cell. Cells of the same kind are set as those of the first cell region, thereby realizing efficient layout. Patent document 3 (Japanese Unexamined Patent Application Publication No. 04-144153) and patent document 4 (Japanese Unexamined Patent Application Publication No. 01-239871) each disclose a technique of imparting attributes to the end portion, edge, or boundary between cells, thereby allowing sharing of the end portions of the cells. However, it cannot be said that even the above techniques disclosed in these patent documents sufficiently attain the object of reducing the device placement area, and a better solution is being desired.

SUMMARY OF THE INVENTION

Accordingly, it is an object of the present invention to provide a design method and a design system which make it possible to achieve a further reduction in device placement area when executing a design using standard cells.

The design method for a semiconductor integrated circuit according to the present invention uses shareability information for determining whether standard cells that are placed adjacent to each other can share part of their regions. That is, the determination as to whether standard cells can be placed so that adjacent standard cells can share part of their regions when performing automatic placement, is made through comparison between net names of respective regions within the standard cell. Depending on the determination result, standard cells to be placed adjacent to each other at the time of the placement of standard cells are placed so as to share part of their regions.

While the present invention basically adopts the technique as described below in order to solve the above-mentioned problems, it is needless to mention that its applied techniques according to various modifications made without departing from the technical scope of the present invention are also included within the present invention.

A design method for a semiconductor integrated circuit according to a first aspect of the present invention comprises the steps of splitting a region on either side of a layout pattern of a standard cell into a plurality of regions and preparing a cell library in which shareability information is added to each of the plurality of regions.

In the design method according to the first aspect, it is desirable that cell regions of adjacent standard cells are shared with each other on the basis of the shareability information.

In the design method according to the first aspect, when determining a direction in which a standard cell is placed on the basis of the shareability information, a placement orientation of the standard cell is selected so that the largest number of cell regions can be shared between adjacent cells.

In the design method according to the first aspect, it is desirable that a plurality of cell libraries having different shareability information are prepared with respect to a single standard cell, and a standard cell that allows the largest number of cell regions to be shared between adjacent cells is selected from among the plurality of cell libraries.

"In the design method according to the first aspect, it is desirable that the plurality of regions are regions obtained by splitting the layout pattern of the standard cell into a left region, a center region, and a right region, and further splitting each of the left region and the right region into a PMOS region, an NMOS region, and a PN isolation region."

In the design method according to the first aspect, it is desirable the shareability information is a pin name.

According to a second aspect of the present invention, a design system for a semiconductor integrated circuit is provided to execute any one of the above-mentioned design methods.

A design method for a semiconductor integrated circuit according to a third aspect comprises the steps of splitting a region on either side of a layout pattern of a standard cell into a plurality of regions, preparing a cell library in which shareability information is added to each of the plurality of regions, and determining a standard cell candidate corresponding to circuit information from the cell library. The design method further comprises determining a placement orientation candidate for the standard cell candidate, determining whether sharing of region is possible between adjacent cells on the basis of the shareability information, and determining the standard cell candidate and the placement orientation and placing the standard cell candidate, so that the number of sharable regions becomes the maximum.

In the design method according to the second aspect, it is desirable that the step of determining whether the sharing is possible is executed individually with respect to each of left and right regions of the standard cell candidate.

A design system for a semiconductor integrated circuit according to a fourth aspect comprises a program storage section storing a program for executing the steps in the design method according to the second aspect, a central processing unit for executing the steps by reading the program from the program storage section, and a data storage unit.

In the design method for a semiconductor integrated circuit according to the present invention, as a cell library, the layout pattern of a standard cell is split into a plurality of regions, and shareability information having pin names is added to each of the regions. Further, a plurality of standard cells having different pin names in their respective regions are prepared with respect to a single circuit. When cells are to be placed adjacent to each other through the automatic placement of standard cells, in accordance with the shareability information of a placement candidate cell, the cell is placed in the direction allowing sharing. When the sharing fails, a placement candidate cell is selected again from among the plurality of cells, and after making a determination as to whether sharing is possible, the cell is placed in the direction allowing the sharing.

By thus repeating such simple determinations, it is possible to obtain a semiconductor integrated circuit with the device placement area reduced to two-thirds or three-fourth as compared with that of the conventional method. Further, since the shareability information is simple information consisting solely of the correspondence information between cell region names and circuit pins, the determination as to whether a cell can share part of its region with another cell can be realized through execution of simple information processing, so the determination can be processed at high speed on a computer.

Therefore, the present invention can provide a design method and design system for a semiconductor integrated circuit which enable automatic placement that realizes a small device placement area.

DESCRIPTION OF THE PREFERRED EMBODIMENTS

An embodiment of the present invention will be described below in detail with reference to FIGS. 1 to 20.

Figure 1:
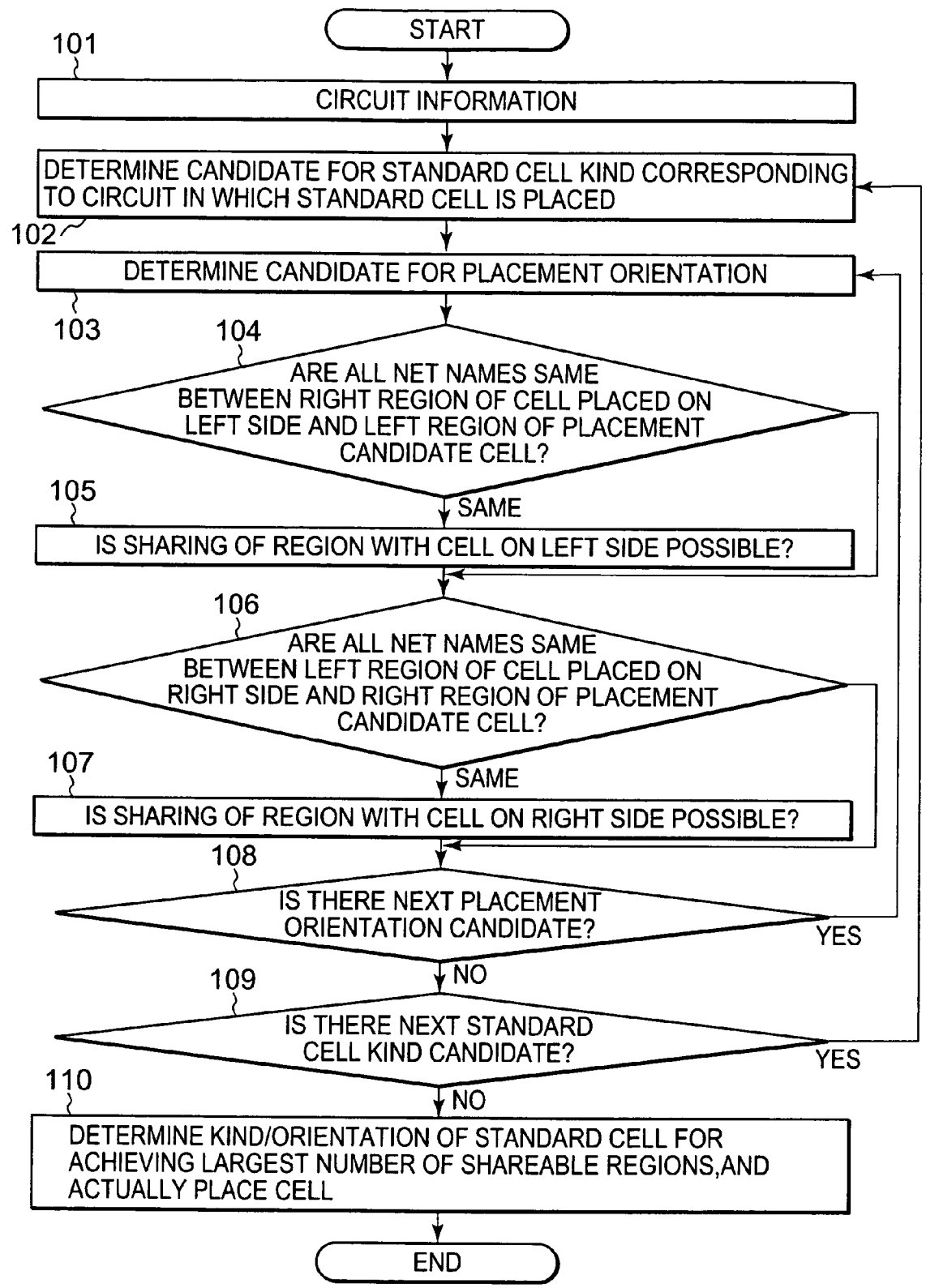
FIG. 1 is a flow chart showing the process from the start to the end of the placement of a standard cell by a design method according to the present invention.

FIG. 1 is a flow chart showing the process from the start to the end of the placement of a single standard cell by a design method for a semiconductor integrated circuit according to the present invention. In step 101, circuit information on the circuit to be realized is read. This circuit information is one obtained by the conventional design method. In step 102, a candidate for the standard cell kind to be placed in accordance with the circuit information read in step 102 is determined. In step 103, a candidate for the placement orientation of the standard cell is determined. In steps 104 and 105, it is determined whether standard cells can be placed so that the right region of a standard cell placed on the left side and the left region of the candidate standard cell to be placed are shared with each other.

In steps 106 and 107, in the same manner as in steps 104 and 105, it is determined whether standard cells can be placed so that the left region of a standard cell placed on the right side and the right region of the candidate standard cell to be placed are shared with each other. In step 108, it is determined whether the next candidate for the placement orientation exists. If the next candidate for the placement orientation exists, the process returns to step 103, and if the next candidate for the placement orientation does not exist, the process transfers to step 109. In step 109, it is determined whether the next candidate for the standard cell kind exists. If the next candidate for the standard cell kind exists, the process returns to step 102, and if the next candidate for the standard cell kind does not exist, the process transfers to step 110. In step 110, the kind and orientation of the standard cell to be placed are determined, and the cell is actually placed.

Figure 20:
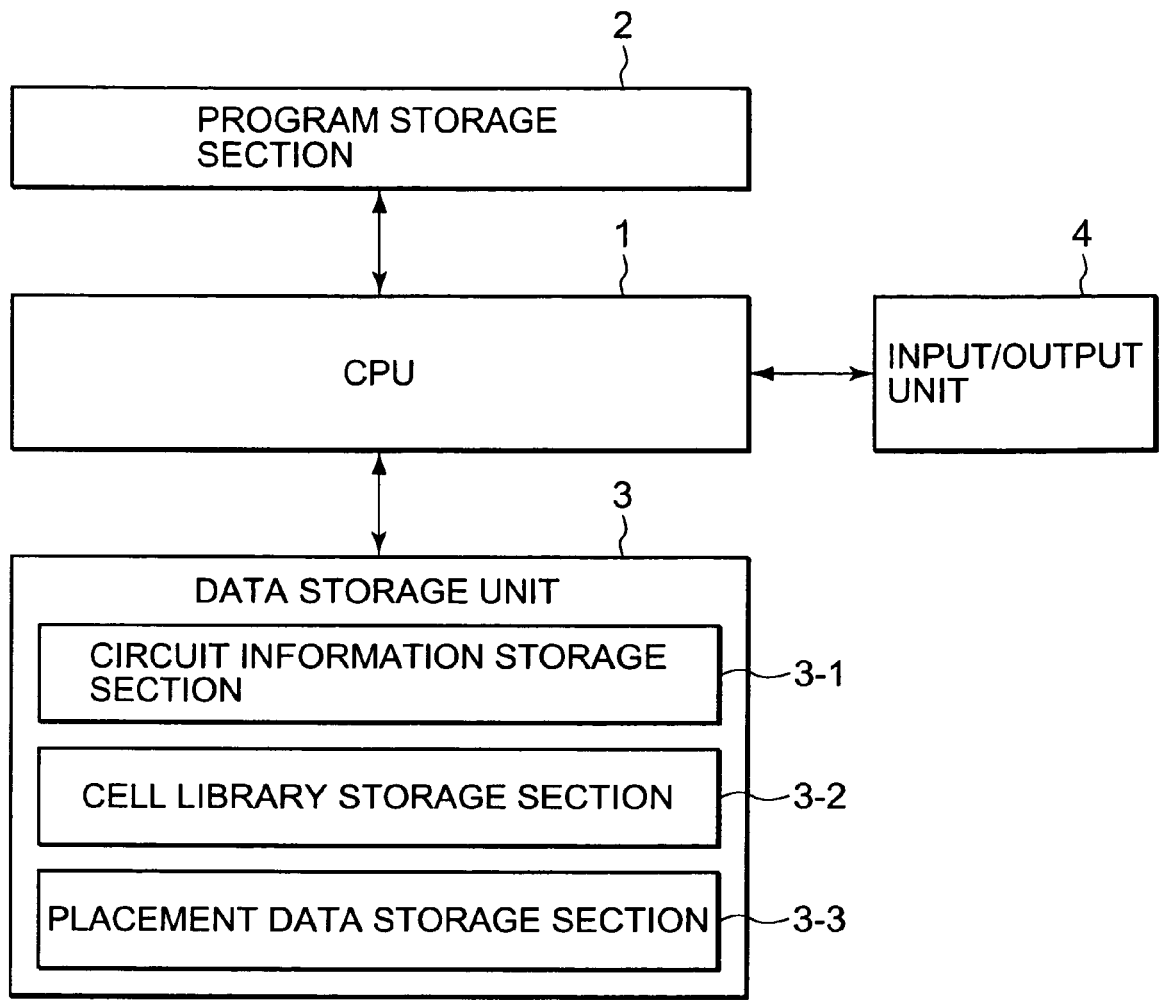
FIG. 20 is a block diagram showing the configuration of a design system according to the present invention.

As shown in FIG. 20, a design system used in the present invention includes a central processing unit (CPU) 1, a program storage section 2, a data storage unit 3, and an input/output unit 4. The central processing unit 1, which executes the flow shown in FIG. 1, executes processing on the basis of a program. The program storage section 2 stores a program. The data storage unit 3 has a circuit information storage section 3-1, a cell library storage section 3-2, a placement data storage section 3-3, and the like. The input/output unit 4 performs display and printing of data.

Figure 2:
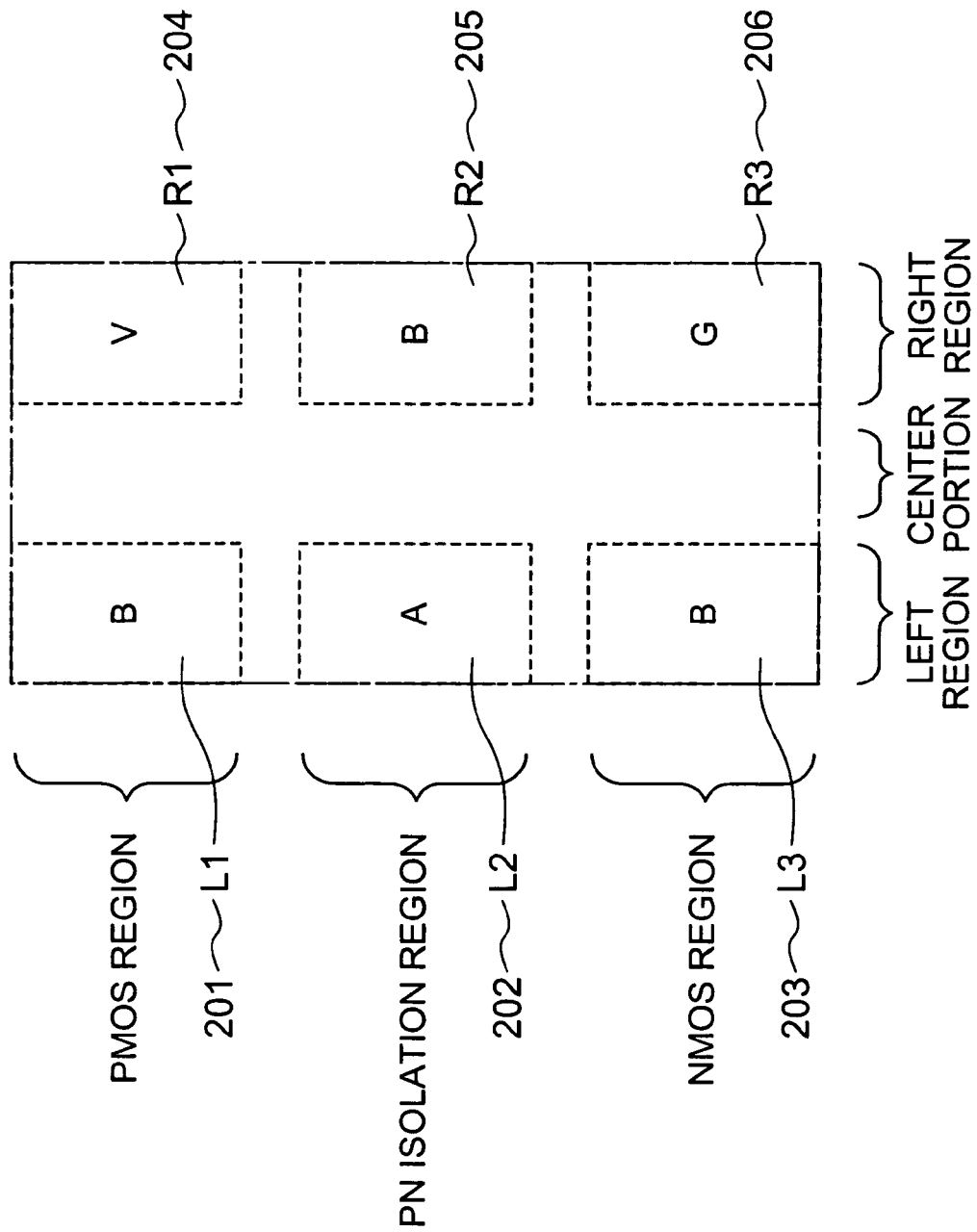
FIG. 2 is a diagram for explaining definitions relating to the names of regions of shareability information in the design method according to the present invention.

FIG. 2 is a diagram for explaining definitions relating to the names of regions of shareability information constituting a characteristic feature of the present invention. A standard cell is split into a left (L) region, a center portion, and a right (R) region with respect to the transverse (X-axis) direction. The left and right regions are regions that can be shared with an adjacent standard cell. The left and right regions are further split into a PMOS region (L1, R1), a PN isolation region (L2, R2), and an NMOS region (L3, R3), respectively, represented as regions 201, 202, 203, 204, 205, and 206. The names of pins connected to the devices placed in the regions 201 to 206 are defined as shareability information. This serves as a unit for checking whether sharing is possible through comparison between the net names of circuit information corresponding to the pin names managed by the shareability information of standard cells.

Figure 3:
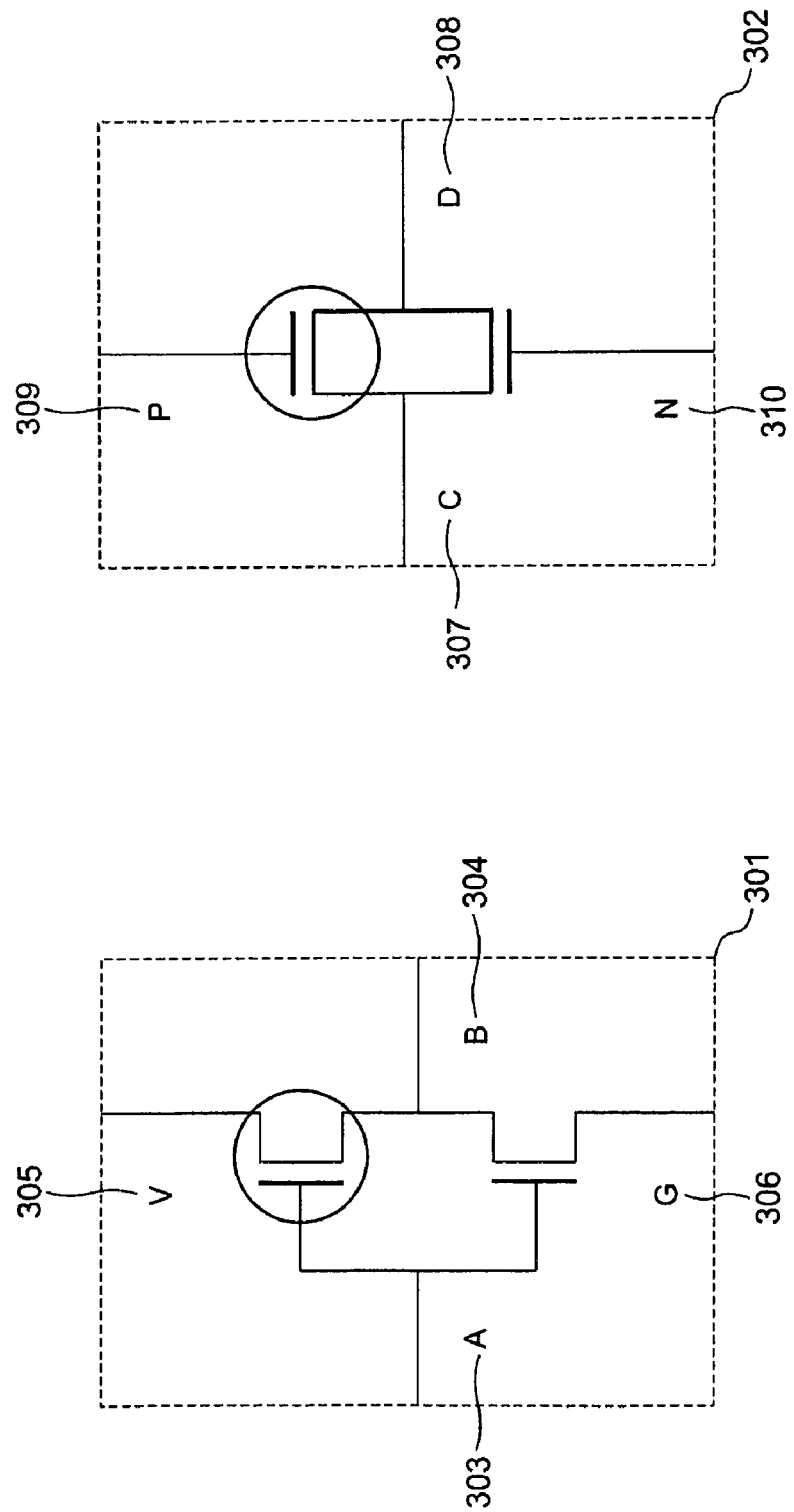
FIG. 3 is a diagram showing an example of a basic circuit prepared as a standard cell.

FIG. 3 shows an example of a basic circuit prepared as a standard cell. In the basic circuit, devices (circuit elements) are placed, and pin names (for example, input A, output B, power source V, and ground potential G) are added to the wiring portions connected to the devices. Here, circuit information 301 is a circuit diagram of an inverter, and circuit information 302 is a circuit diagram of a transfer gate. Circuit information 303, 304, 305, 306, 307, 308, 309, and 310 each indicate a pin name. The circuit information of this kind is stored in the circuit information storage section 3-1 (FIG. 20).

Figure 4:
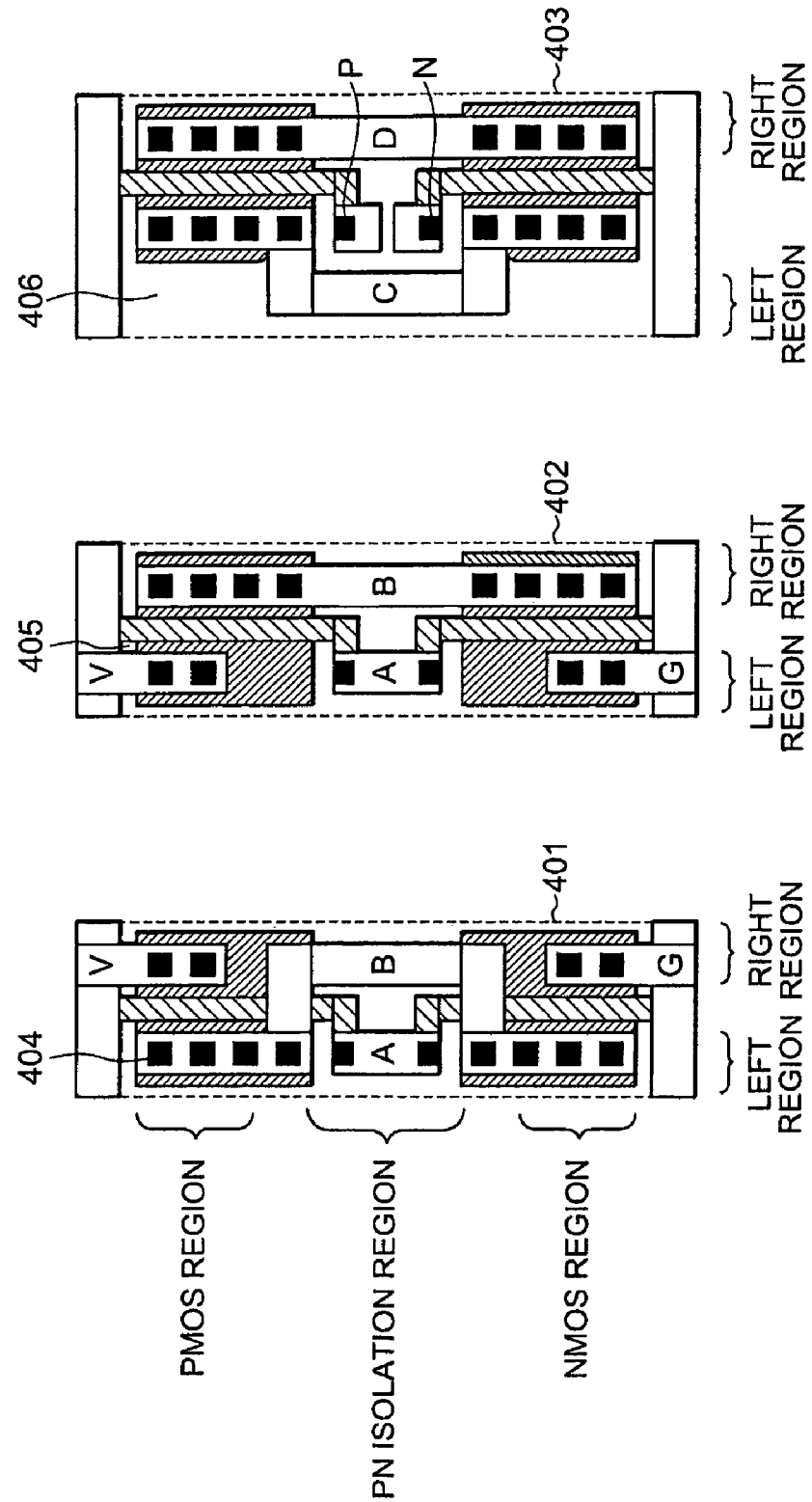
FIG. 4 is a diagram showing standard cell layout patterns based on the basic circuit example shown in FIG. 3.

FIG. 4 shows an example of the layout pattern of a standard cell. Reference numerals 401 and 402 indicate the layouts of standard cells corresponding to the inverter 301 shown in FIG. 3. Reference numeral 403 indicates the layout of a standard cell corresponding to the transfer gate 302 shown in FIG. 3.

Figure 5:
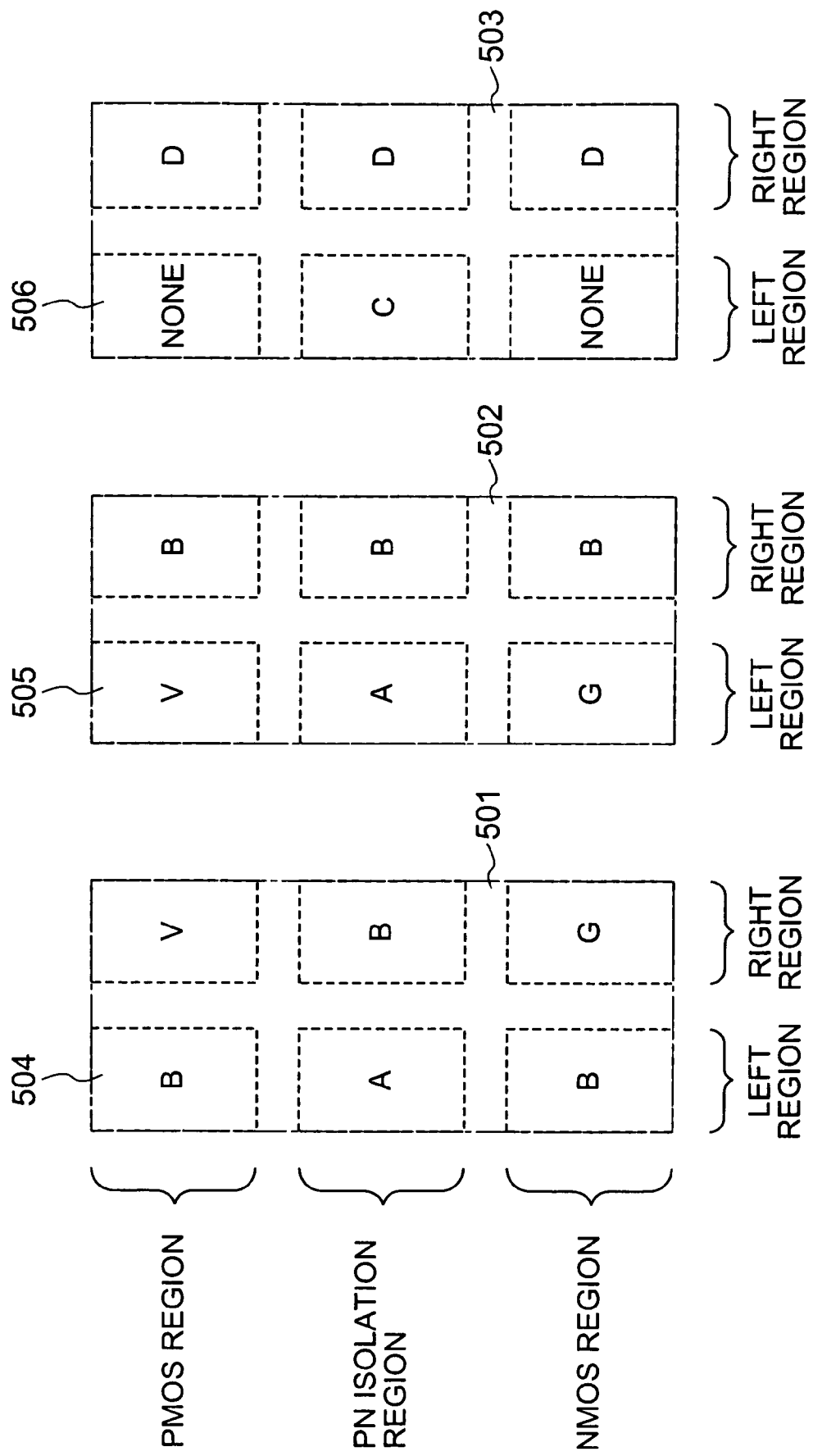
FIG. 5 is a diagram for explaining shareability information of standard cells.

FIG. 5 is an explanatory diagram concisely illustrating the shareability information of standard cells. Reference numerals 501, 502, and 503 respectively indicate shareability information included in the standard cells of the layouts 401, 402, and 403 shown in FIG. 4. Each of the six regions of each standard cell has a pin name as the shareability information.

Figure 6:
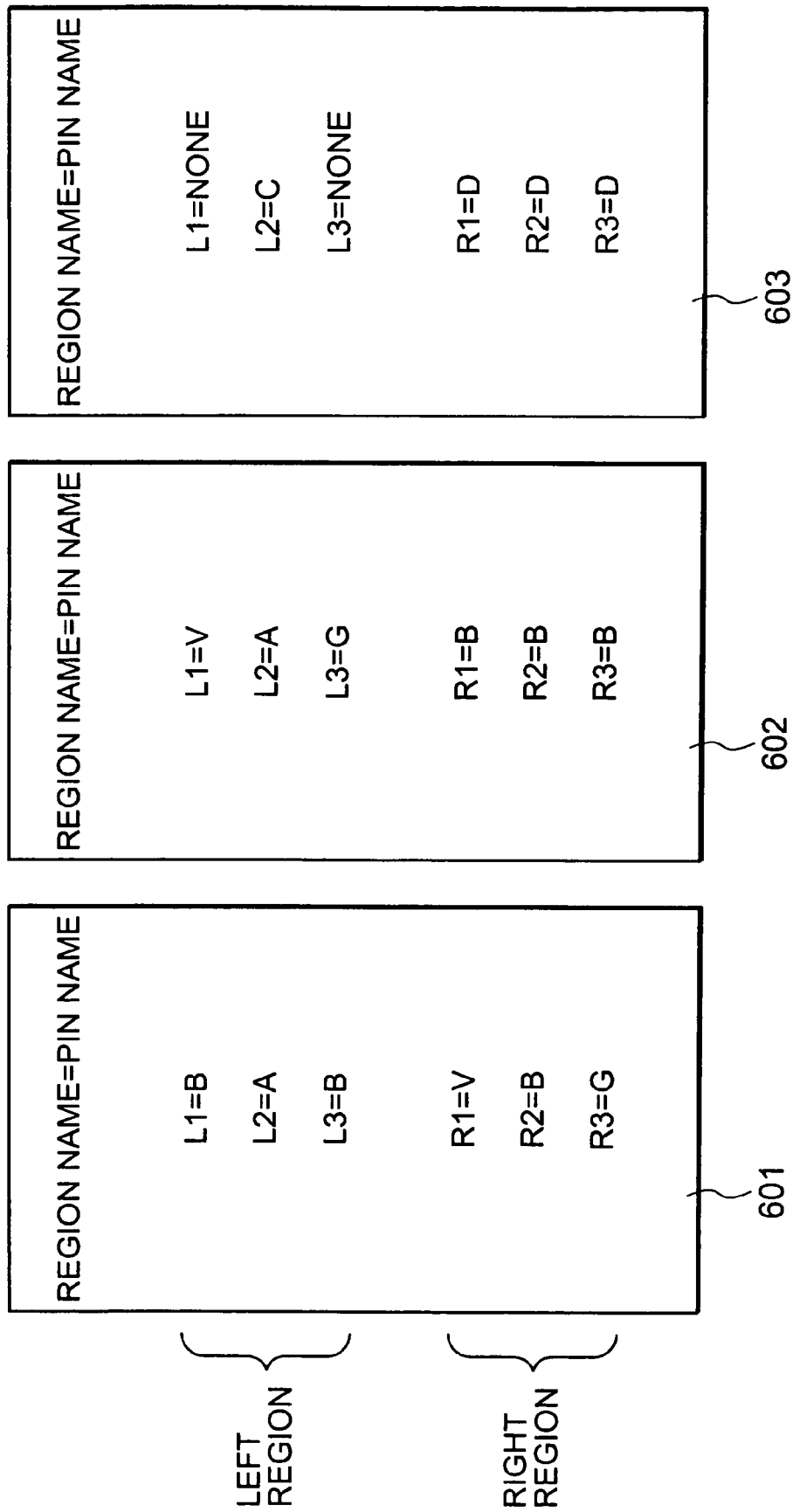
FIG. 6 is a diagram showing shareability information data of standard cells.

FIG. 6 shows the very shareability information data of standard cells. Reference numerals 601, 602, and 603 indicate shareability information data obtained by extracting only region names and pin names from the shareability information indicated at 501, 502, and 503 shown in FIG. 5.

Figure 7:
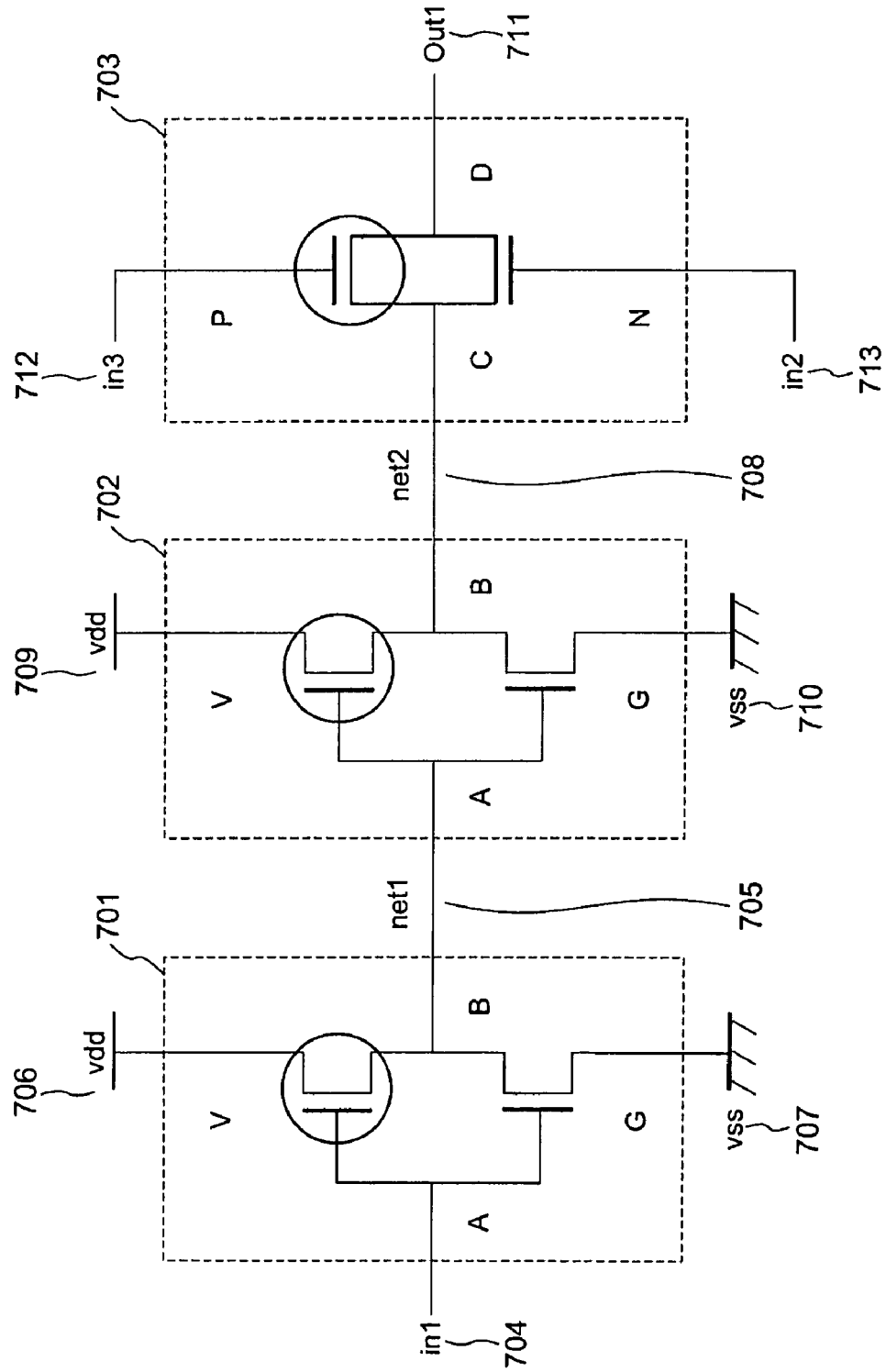
FIG. 7 is a circuit information diagram to which the present invention is applied.

FIG. 7 shows circuit information according to an embodiment of the present invention. Circuits corresponding to standard cells, such as inverters 701 and 702, and transfer gate 703, are placed as the circuit information. Net names, such as those indicated at 704, 705, 706, 707, 708, 709, 710, 711, 712, and 713, are added to the wiring portions connected to the respective standard cells. For example, the net name indicated at 704 is input in1, the net name indicated at 705 is node net1, and the net name indicated at 706 is power source vdd.

Figure 8:
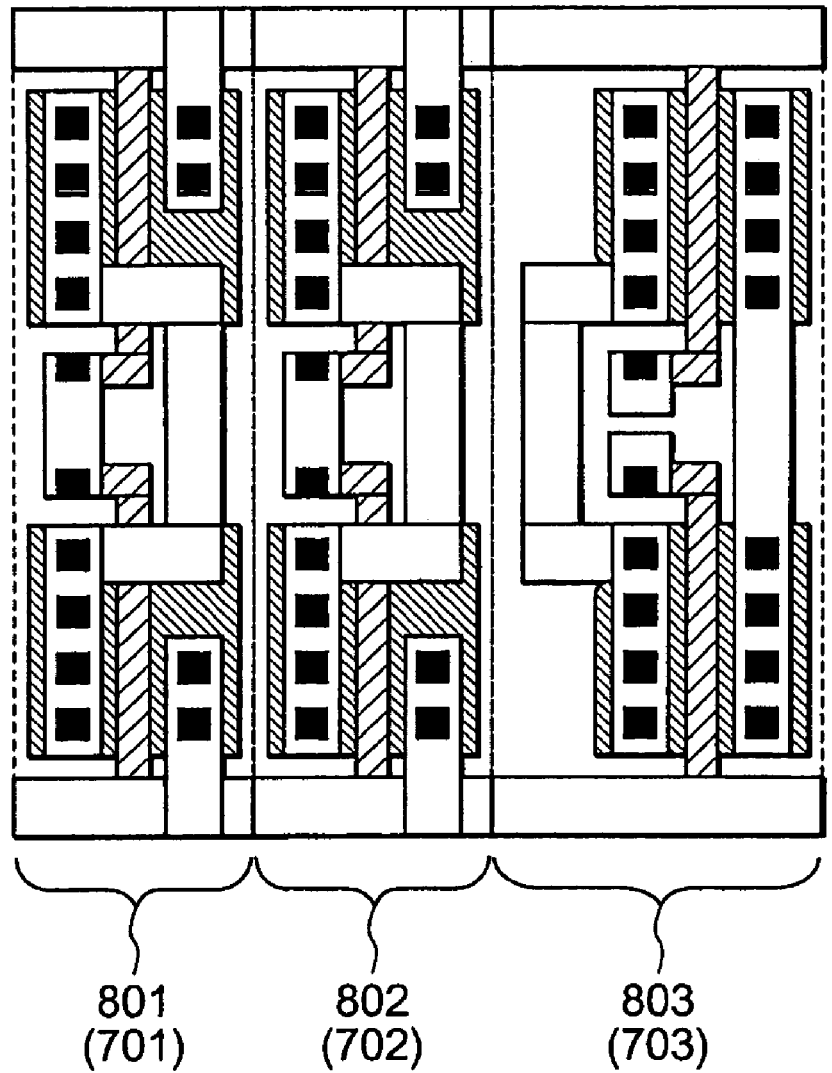
FIG. 8 is a diagram showing the automatic placement of standard cells in the case where the conventional design method is applied to the circuit information diagram shown in FIG. 7.

FIG. 8 shows the result of automatically placing standard cells according to the conventional method on the basis of the circuit information shown in FIG. 7. Reference numerals 801, 802, and 803 respectively indicate the layout patterns of standard cells corresponding to the inverters 701 and 702, and the transfer gate 703 shown in FIG. 7.

Figure 9:
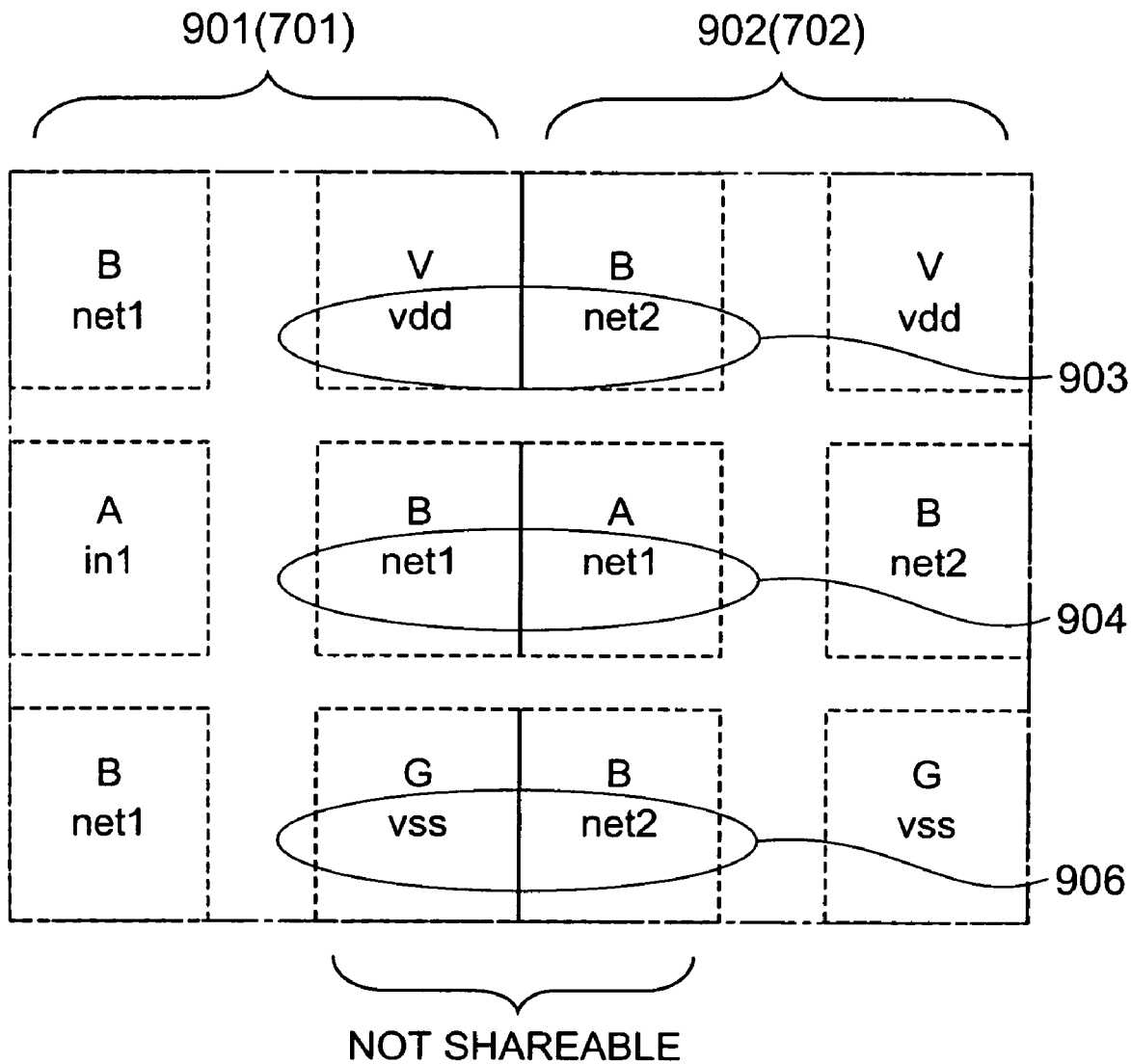
FIG. 9 is a diagram for explaining shareability information (1) in a state when standard cells are being automatically placed in the case where the design method according to the present invention is applied to the circuit information diagram shown in FIG. 7.

FIG. 9 is an explanatory diagram of shareability information (1) in a state in which standard cells with respect to the circuit information shown in FIG. 7 are being automatically placed by the design method according to the present invention. Of the circuit information shown in FIG. 7, only the inverters 701 and 702 are considered here.

Figure 10:
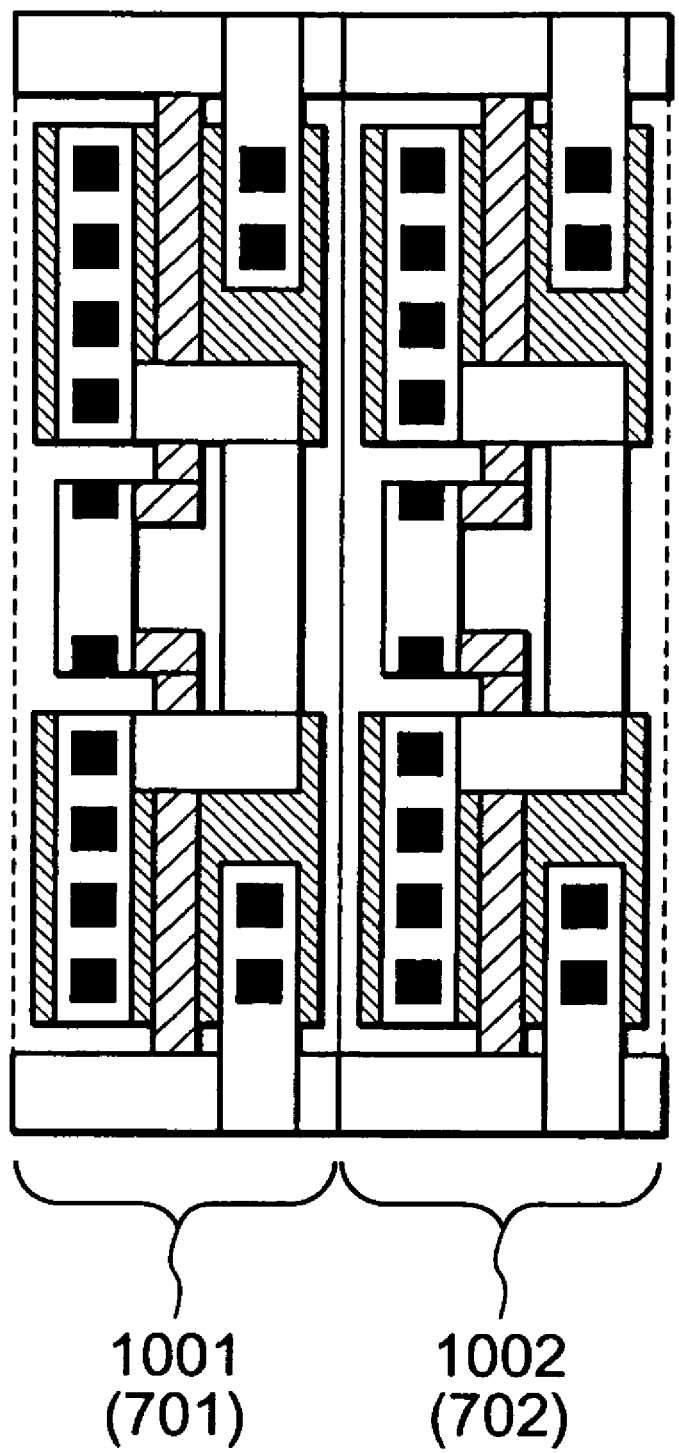
FIG. 10 is a diagram showing the automatic placement of standard cells with respect to the shareability information (1) shown in FIG. 9.

FIG. 10 is a diagram showing the automatic placement of standard cell patterns with respect to the shareability information (1) shown in FIG. 9. Here, since sharing of regions is not possible, standard cells are placed so as not to overlap with each other.

Figure 11:
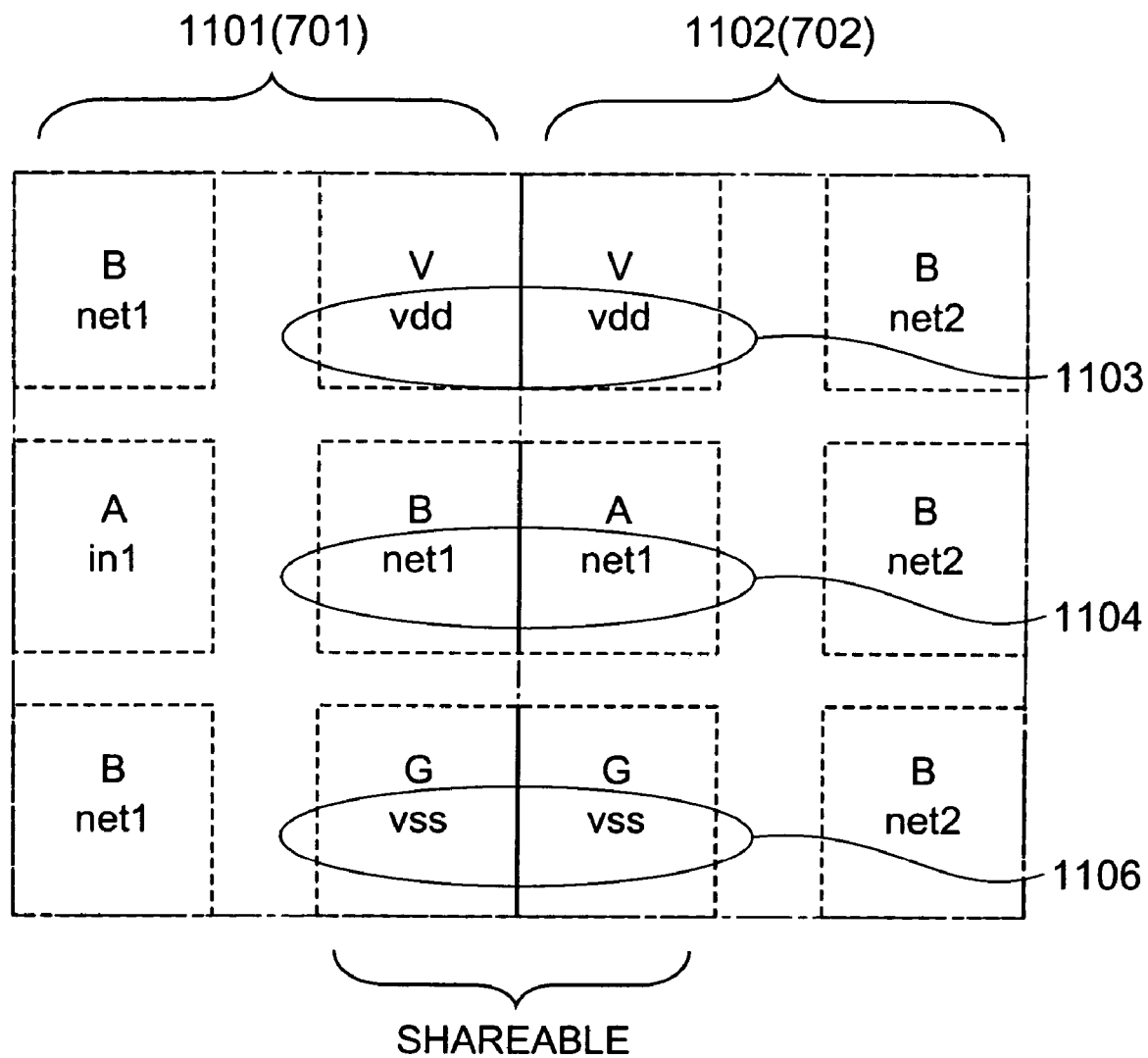
FIG. 11 is a diagram for explaining shareability information (2) in a state when standard cells are being automatically placed in the case where the design method according to the present invention is applied to the circuit information diagram shown in FIG. 7.

FIG. 11 is an explanatory diagram of shareability information (2) in a state in which standard cells with respect to the circuit information shown in FIG. 7 are being automatically placed by the design method according to the present invention. Since sharing of regions is not possible in FIG. 9, the placement orientation of the inverter 702 is changed in FIG. 11.

Figure 12:
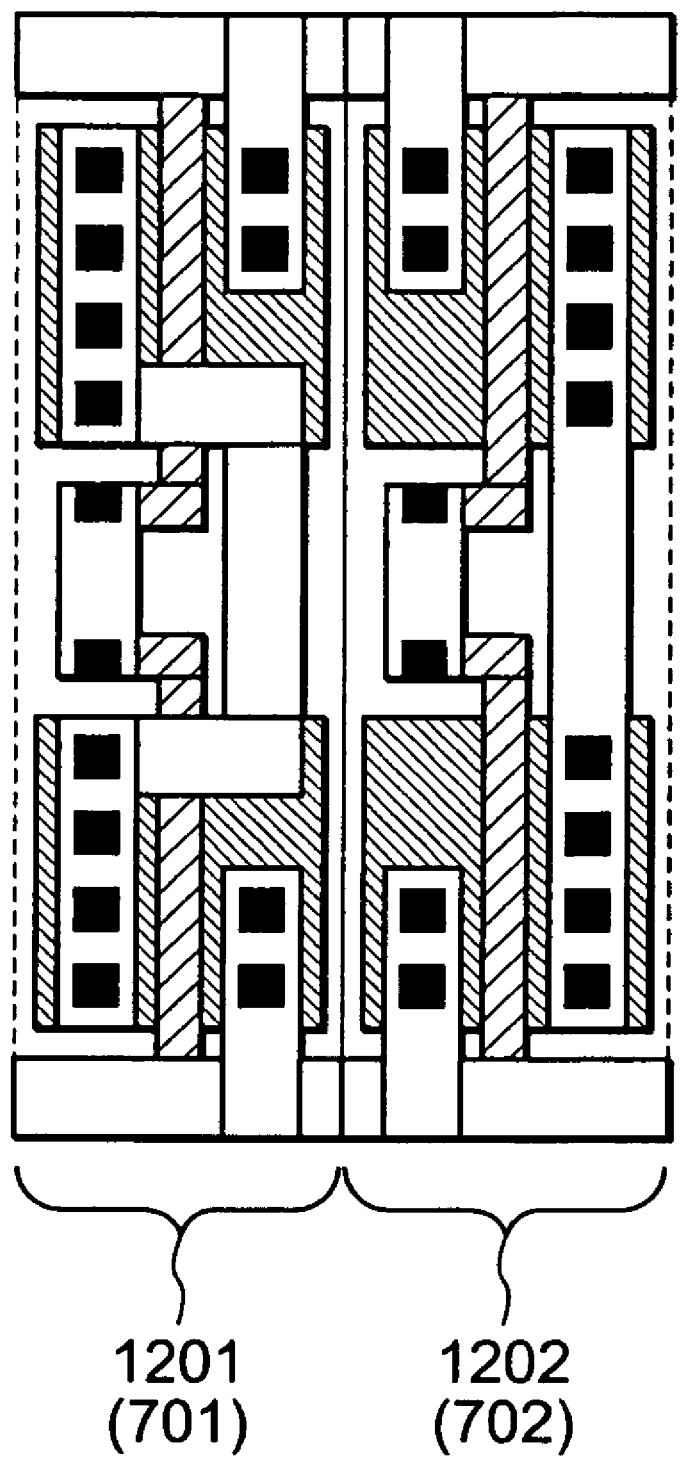
FIG. 12 is a diagram showing the automatic placement of standard cells with respect to the shareability information (2) shown in FIG. 11.

FIG. 12 is a diagram showing the automatic placement of standard cells with respect to the shareability information (2) shown in FIG. 11.

Figure 13:
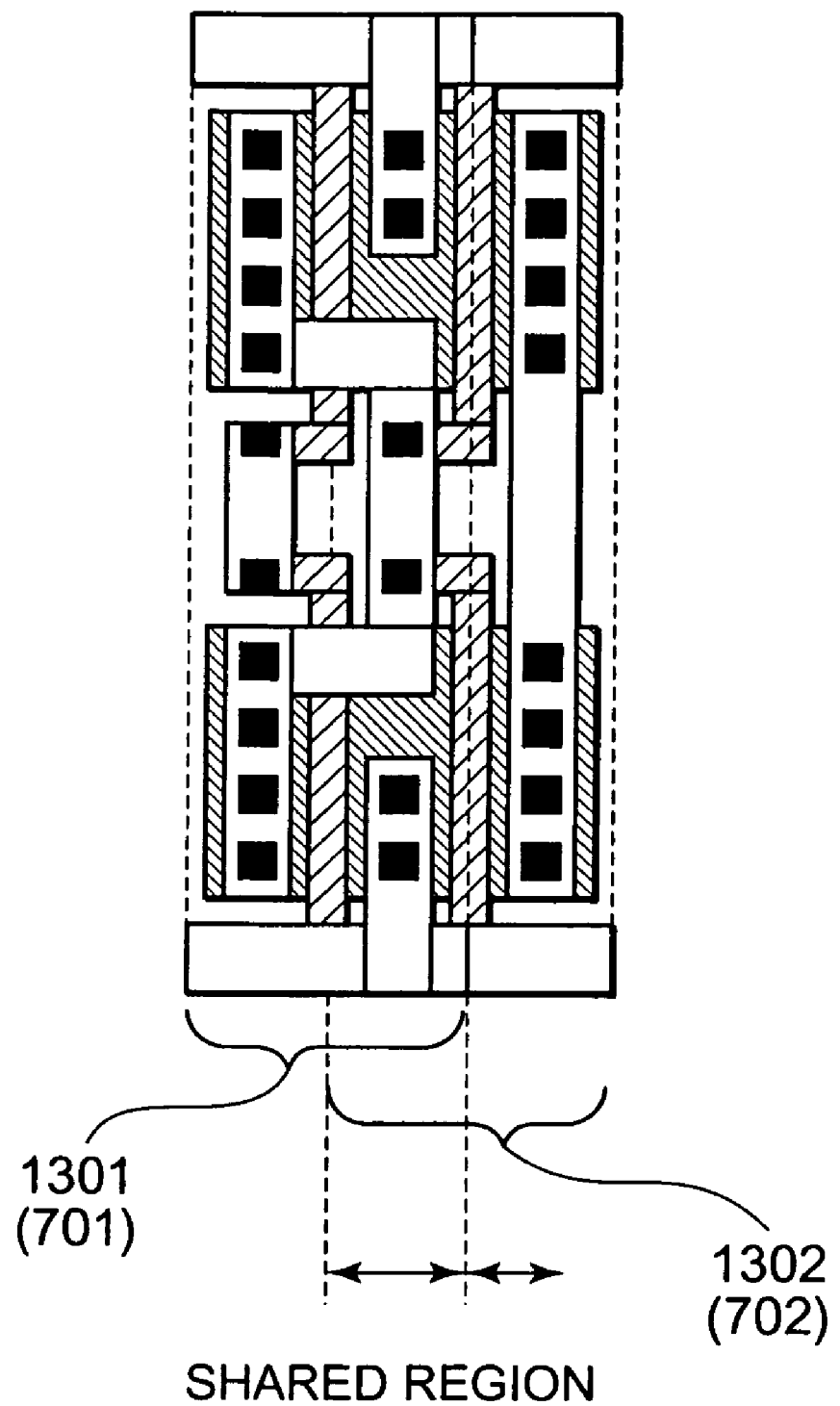
FIG. 13 is a diagram, corresponding to the automatic placement diagram of FIG. 12, showing the automatic placement of standard cells after the execution of cell sharing.

FIG. 13 is a diagram, corresponding to the automatic placement diagram of FIG. 12, showing the automatic placement of standard cells after the execution of sharing.

Figure 14:
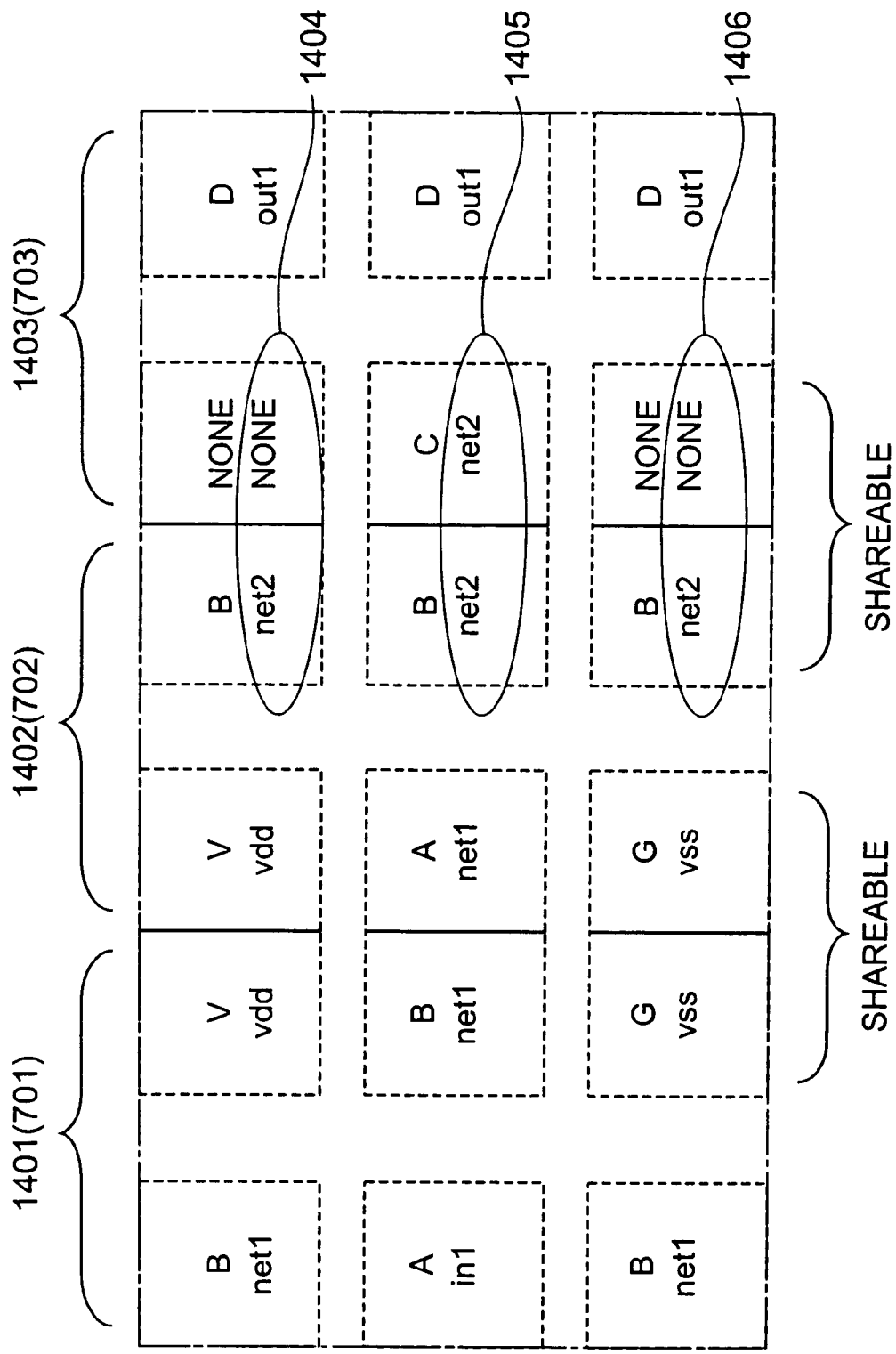
FIG. 14 is a diagram for explaining shareability information (3) in the final state for automatically placing standard cells in the case where the design method according to the present invention is applied to the circuit information diagram shown in FIG. 7.

FIG. 14 is an explanatory diagram of shareability information (3) in the final state for automatically placing standard cells with respect to the circuit information shown in FIG. 7 by the design method according to the present invention. Although the placement of the inverters 701 and 702 has been considered in the foregoing, the placement of the transfer gate 703 is considered here.

Figure 15:
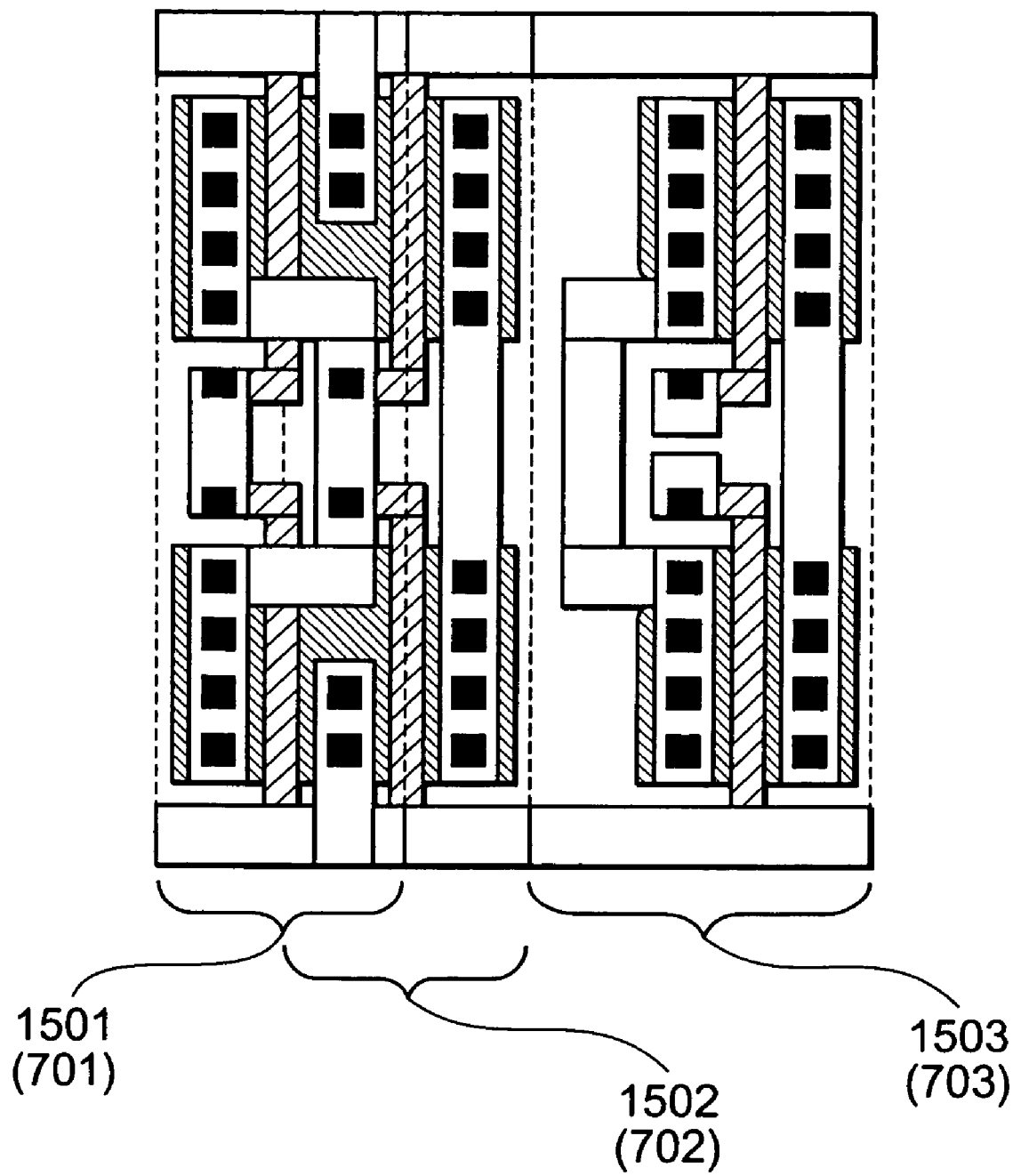
FIG. 15 is a diagram showing the automatic placement of standard cells with respect to the shareability information (3) shown in FIG. 14.

FIG. 15 is a diagram showing the automatic placement of standard cells with respect to the shareability information (3) shown in FIG. 14.

Figure 16:
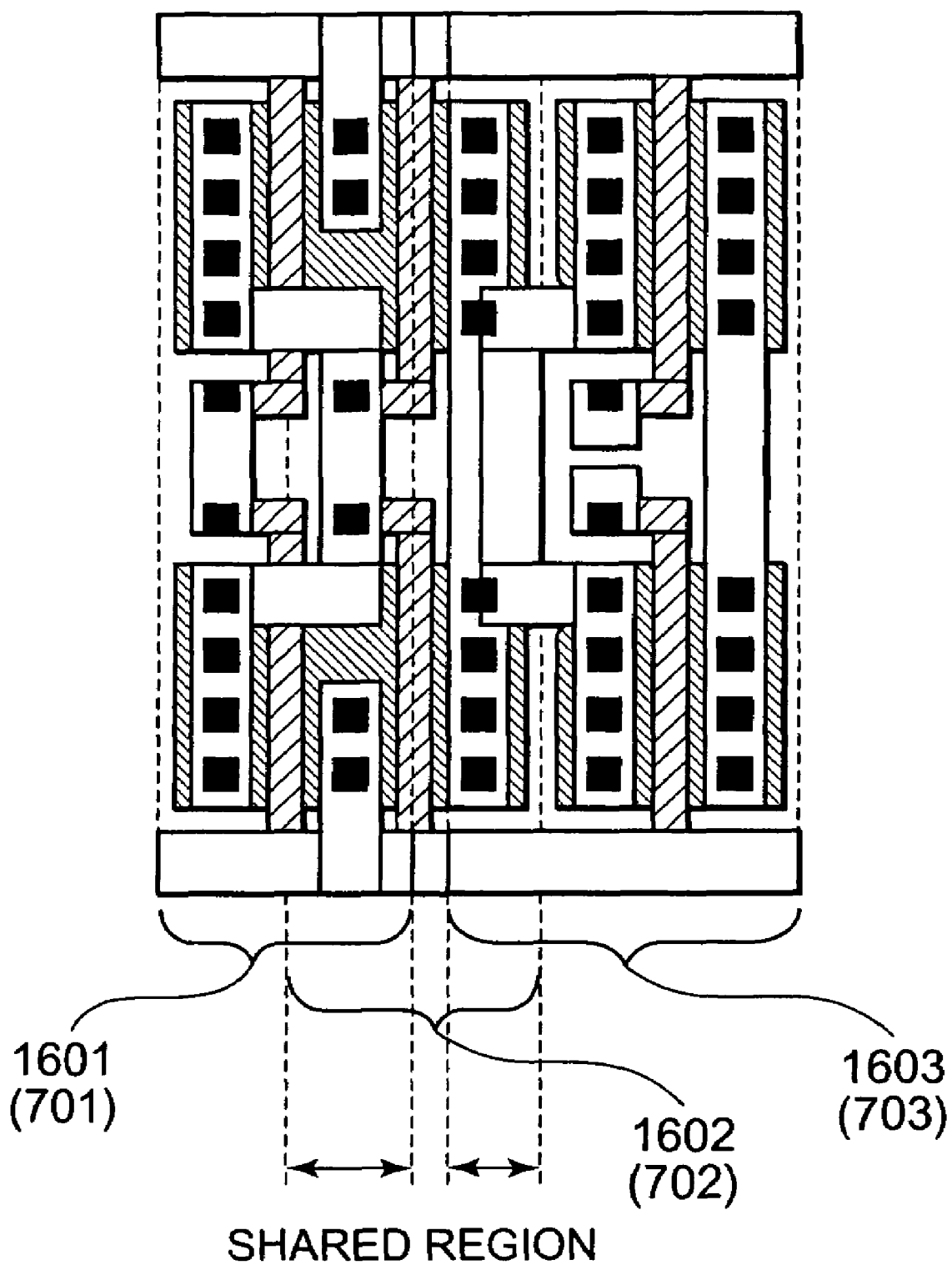
FIG. 16 is a diagram, corresponding to the automatic placement diagram of FIG. 15, showing the automatic placement of standard cells after the execution of cell sharing.

FIG. 16 is a diagram, corresponding to the automatic placement diagram of FIG. 15, showing the automatic placement of standard cells after the execution of sharing.

Next, shareability information constituting a characteristic feature of the present invention will be described. First, as in the conventional method, prior to starting the automatic placement, standard cells necessary for executing a design are prepared in advance in the cell library storage section 3-2 (FIG. 20). The inverter 301 and the transfer gate 302 shown in FIG. 3 are the examples of the basic circuits of standard cells. Although different in their configuration, the inverters 401 and 402 shown in FIG. 4 are both the layout pattern of a standard cell corresponding to the inverter 301 shown in FIG. 3. The inverters 401 and 402 characteristically differ from each other in their pin position due to the difference in their configuration.

Further, the transfer gate 403 shown in FIG. 4 is the layout pattern corresponding to the transfer gate 302 shown in FIG. 3.

The present invention aims to reduce the device placement area by causing standard cells that are placed adjacent to each other to share part of their regions when automatically placing standard cells. Accordingly, as information for determining whether adjacent standard cells can share part of their regions, shareability information as read from the standard cell configuration is registered in advance.

Shareability information of a standard cell is information obtained by splitting a layout pattern into several regions that potentially allow sharing, and associating each of the regions with the pin of a circuit corresponding to the region. Although the regions that potentially allow sharing differ according to the structure of a standard cell, in the case of a common CMOS structure, as shown in FIG. 2, a total of six regions, including three regions consisting of the PMOS region, the NMOS region, and the PN isolation region at the left end portion of a cell which can be potentially shared and three similar regions at the right end portion of the cell, are defined as the regions that allow sharing. In the example shown in FIG. 2, the names of the respective regions are defined as L1, L2, L3, R1, R2, and R3, as indicated at 201 to 206.

On the basis of the definitions for shareability information shown in FIG. 2, shareability information is registered into the cell library storage section 3-2 (FIG. 20) with respect to the standard cells shown in FIG. 4. Shareability information to be registered with respect to the inverters 401 and 402, and the transfer gate 403 shown in FIG. 4 are illustrated concisely in FIG. 5 as indicated at 501, 502, and 503, respectively. For example, it can be appreciated that the pin name B indicated at 304 in FIG. 3 corresponds to the L1 region 404 of the inverter 401 shown in FIG. 4. When this relationship is applied to FIG. 5 concisely illustrating the shareability information, the L1 region 504 of the inverter 501 corresponds to the pin name B. Likewise, the pin name A, the pin name B, the pin name V, the pin name B, and the pin name G correspond to the L2 region, the L3 region, the R1 region, the R2 region, and the R3 region, respectively.

When only the information necessary for achieving sharing is extracted from the inverter 501, the shareability information data indicated at 601 in FIG. 6 results. This information necessary for achieving sharing is registered into the cell library storage section 3-2 as shareability information data. That is, the shareability information data refers to a list of pin names corresponding to the names of the respective regions of a standard cell. Likewise, shareability information data is also registered with respect to the inverter 402 and the transfer gate 403 shown in FIG. 4. The respective shareability information data obtained with respect to 502 and 503 in FIG. 5 are as indicated at 602 and 603 in FIG. 6, respectively. Circuit design is started at the time when the registration of the shareability information data with respect to each of the standard cells is completed, thereby making it possible to execute automatic placement of the standard cells.

Next, with the circuit shown in FIG. 7 taken as an example, the embodiment of the present invention will be described with reference to the flowchart shown in FIG. 1.

FIG. 7 shows a circuit including two inverters 701 and 702 and one transfer gate 703. In the circuit, net names corresponding to the pin names of respective standard cells are generally added as indicated at 704 to 713. For example, 704 indicates input in1 and 706 indicates power source vdd. FIG. 1 is a flow of the process from the start to the end of the placement of one standard cell.

First, a standard cell corresponding to the inverter 701 shown in FIG. 7 is placed. To do so, in step 101 of FIG. 1, circuit information on the circuit in which the standard cell is to be placed is read, and in step 102, a candidate for the standard cell to be actually placed is determined. Here, when a plurality of standard cells are registered with respect to one circuit, first, the first of those standard cells is determined as the candidate. In the present invention, it proves particularly effective to prepare a plurality of standard cells with respect to one circuit. By selecting standard cells allowing sharing of the greatest number of regions from among the plurality of standard cells and finally placing those standard cells, the device placement region can be reduced.

In this example, two kinds of standard cells are prepared as corresponding to the inverter 701 shown in FIG. 7. The inverters 401 and 402 shown in FIG. 4 correspond to those standard cells. First, the inverter 401 is determined as a placement candidate. In step 103 of FIG. 1, a candidate for the placement orientation of the standard cell is determined. The placement orientation refers to inversion or rotation. When there are a plurality of placement orientation candidates, the first of those orientations is determined as a candidate first. In steps 104 to 107 of FIG. 1, it is determined whether, when the standard cell determined as the placement candidate is placed, the standard cell can share part of its region with the standard cells located on its left and right. It should be noted, however, that at the point when placing the first standard cell, the shareability determination is not necessary since there are no other cells placed around that standard cell.

In step 108 of FIG. 1, if the next candidate for the placement orientation exists for the standard cell that is determined as a placement candidate, this placement orientation is determined as the next candidate and the process returns to step 103. Further, in step 109 of FIG. 1, when another standard cell exists with respect to the circuit determined as a placement candidate, this standard cell is determined as the next standard cell candidate and the process returns to step 102. Here, since the standard cell 402 exists as another standard cell corresponding to the inverter 701 shown in FIG. 7, the process of steps 102 to 109 is repeated again with respect to the standard cell 402. In step 110 of FIG. 1, from among the standard cells determined as placement candidates, the cell that allows the greatest number of its regions to be shared is determined and placed. Since no other cells have been placed yet, sharing of regions is possible with neither the standard cells 401 nor 402, so the inverter 701 is placed for the time being, thus completing the placement.

Next, description will be given of a case where a standard cell corresponding to the inverter 702 shown in FIG. 7 is placed on the right side of the inerter 701. Here, in the same manner as the inverter 701 shown in FIG. 7, a candidate for the standard cell to be placed is determined. In step 104 of FIG. 1, the candidate cell is placed on the right side of the standard cell corresponding to the inverter 701 that has already been placed. Accordingly, it is determined whether sharing is possible between the left region of the standard cell 402 as a placement candidate and the right region of the inverter 701 that has already been placed. The determination is performed by comparing the pin names registered in the shareability information for the right region of the standard cell 401 located on the left side with the pin names registered in the shareability information for the left region of the placement candidate cell located on the right side of the above-mentioned standard cell 401. Then, a determination as to whether sharing is possible is made on the basis of whether the net names connected to the respective pin names match.

Specifically, reference numeral 901 in FIG. 9 indicates shareability information of the cell that has already been placed on the left side, and reference numeral 902 indicates shareability information of the placement candidate cell located on the right side of the above-mentioned cell. Assuming that the net name of the pin name V corresponding to the region R1 of 901 and the net name of the pin name B corresponding to the region L1 of 902 match, and, likewise, the net names match between the region R2 and the region L2 and between the region R3 and the region L3, it is determined that sharing is possible. That is, sharing is determined to be possible when the net names match in each of 903, 904, and 905 in FIG. 9. However, it can be appreciated that since none of the net names match in the example shown in FIG. 9, sharing is not possible with respect to these cells at the time of their placement. As described above, sharing is not achieved when the inverter 401 is placed. Accordingly, when simply placed as it is, it follows that a standard cell 1001 and a standard cell 1002 are simply placed so that these cells do not overlap, so the device placement area is not reduced.

Since the next candidate for the standard cell kind exists in step 109 of FIG. 1, the shareability determination is made using this time the inverter 402 shown in FIG. 4 as the cell candidate for the inverter 702 shown in FIG. 7. Specifically, reference numeral 1101 in FIG. 11 indicates shareability information of the cell that has already been placed on the left side, and reference numeral 1102 indicates shareability information of the placement candidate cell located on the right side of the above-mentioned cell. Here, there is a match between the net name of the pin name V corresponding to the region R1 of 1101 and the net name of the pin name V corresponding to the region L1 of 1102. Further, likewise, the net names match between the region R2 and the region L2 and between the region R3 and the region L3, so it is determined that sharing is possible. That is, sharing is determined to be possible because the net names match in each of 1103, 1104, and 1105 in FIG. 11. As a result, by placing the standard cell 402 for the inverter 702 in step 110 of FIG. 1, the device placement area can be reduced.

FIG. 12 shows a state in which the standard cells 401 and 402 of the inverters 701 and 702 are placed so that there is no cell overlapping. However, since the shareability determination has been made, in actuality, the cells can be placed with part of their regions overlapping each other, as indicated at 1301 and 1302 in FIG. 13, thereby making it possible to reduce the device placement area.

Next, description will be given of a case where a standard cell corresponding to the transfer gate 703 shown in FIG. 7 is further placed on the right of the placement as shown in FIG. 13. Here, in the same manner as the inverter 702 shown in FIG. 7, a candidate for the standard cell to be placed is determined. In step 104 of FIG. 1, since the candidate cell is placed on the right side of the inverter 702 that has already been placed, it is determined whether the left region of the transfer gate 403 as a placement candidate and the right region of the cell of the inverter 702 that has already been placed can be shared with each other. FIG. 14 illustrates shareability information for these regions. In the shareability information, the standard cell 403 of the transfer gate 703 indicated at 1403 is placed on the right side of the standard cell 402 of the inverter 702 indicated at 1402. In this case, a determination as to whether sharing is possible is made on the basis of whether the net names match in all of 1404, 1405, and 1406 or whether the regions concerned have no pin name provided on one side and hence allow sharing without the determination of shareability.

Sharing is possible since the net names match in 1405, and no pin name is provided on one side in each of 1404 and 1406. If the standard cell 403 is placed so that there is no cell overlapping, the placement as indicated at 1502 and 1503 shown in FIG. 15 results. However, since it has been learned through the determination using the shareability information that there is no problem in placing cells in an overlapping manner, the cells are placed as indicated at 1601, 1602, and 1603 in FIG. 16. The state in which these three cells are placed is as shown in FIG. 16. The three standard cells are all placed while having part of their regions shared among each another. Since a plurality of standard cells can be placed with part of their regions shared among each other, the device placement area can be significantly reduced.

Figure 17:
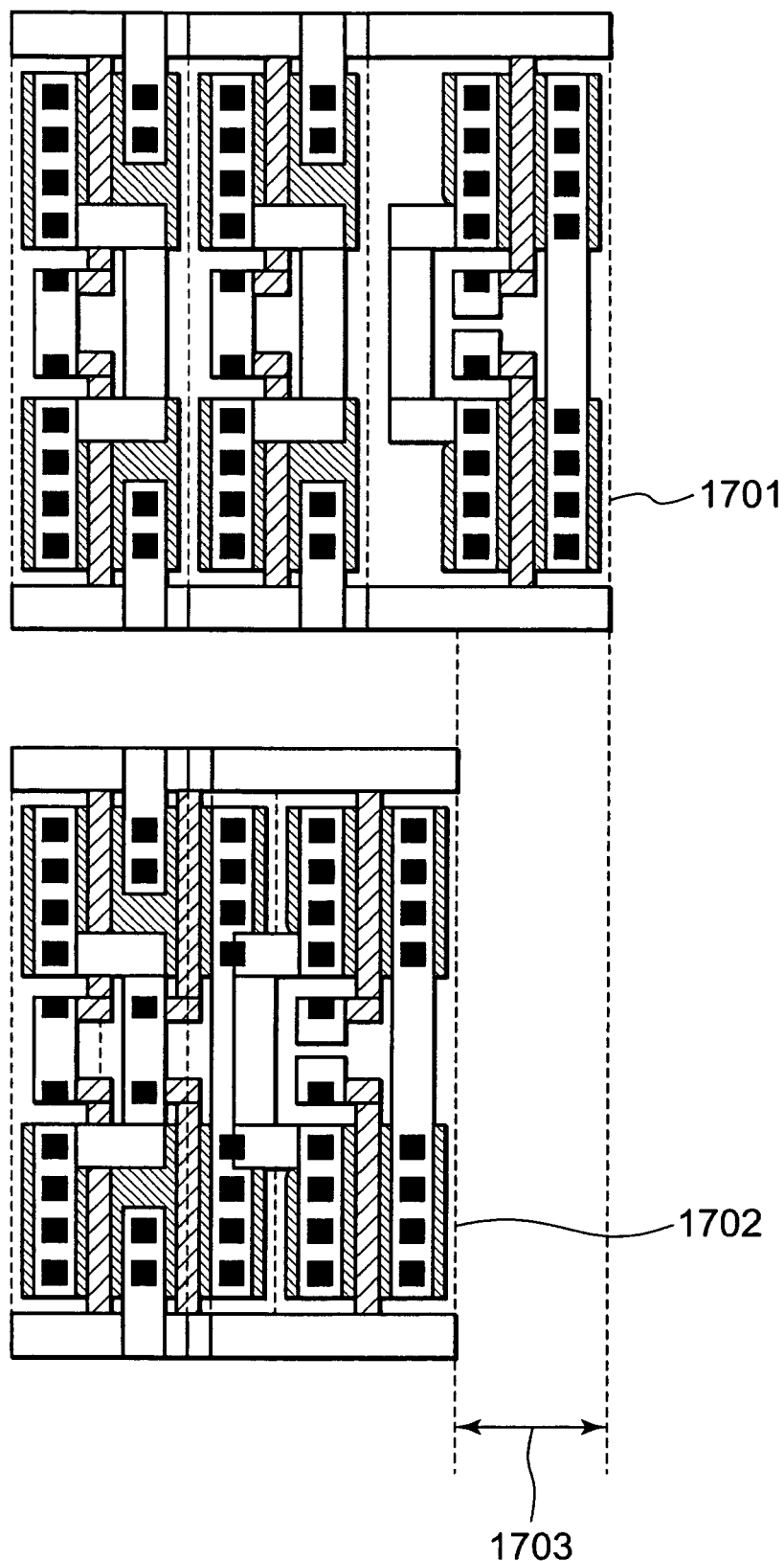
FIG. 17 is a diagram showing the automatic placement of standard cells before and after the execution of cell sharing according to the present invention.

The final device placement area according to the above-described embodiment is shown in FIG. 17. Reference numeral 1701 in FIG. 17 indicates the device placement area for a standard cell placed according to the conventional method shown in FIG. 8, and reference numeral 1702 indicates the device placement area for a standard cell placed according to the method of the present invention. It can be appreciated that as compared with a design according to the conventional method, the device placement area is reduced by the amount of the region indicated at 1703, to two-thirds to three-fourths in size.

Figure 18:
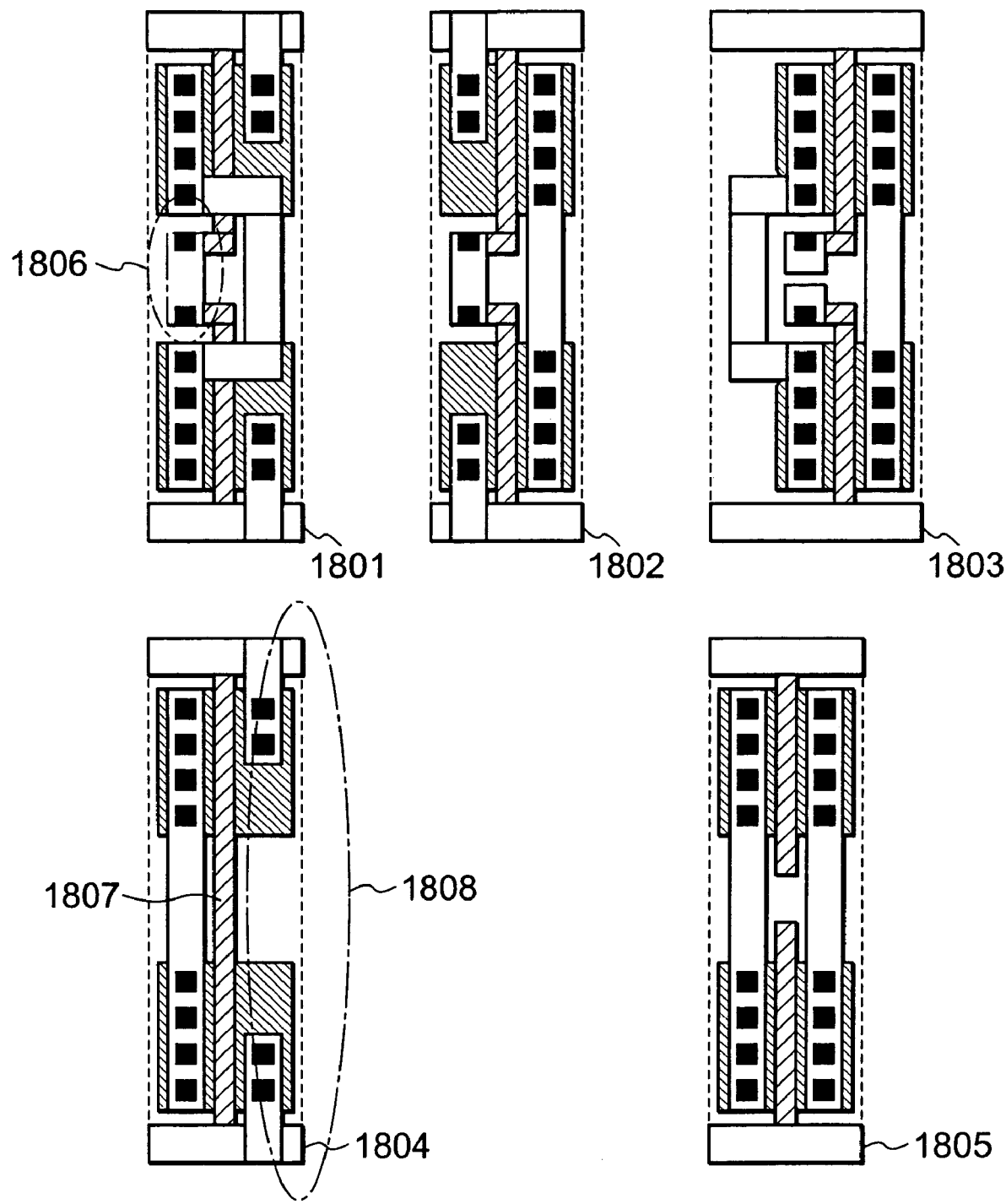
FIG. 18 is a diagram showing layout patterns according to the present invention and the related art.

Further, using the circuit according to the embodiment shown in FIG. 7, the device placement area after the placement of cells is compared between the related art disclosed in the patent document 1 mentioned above and the present invention. The standard cells used are those of a cell configuration optimum for the related art disclosed in the patent document 1. A standard cell 1804 and a standard cell 1805 shown in FIG. 18 are used as the standard cell corresponding to the circuit of the inverter 301 shown in FIG. 3 and the standard cell corresponding to the circuit of the transfer gate 301 shown in FIG. 3, respectively.

Figure 19:
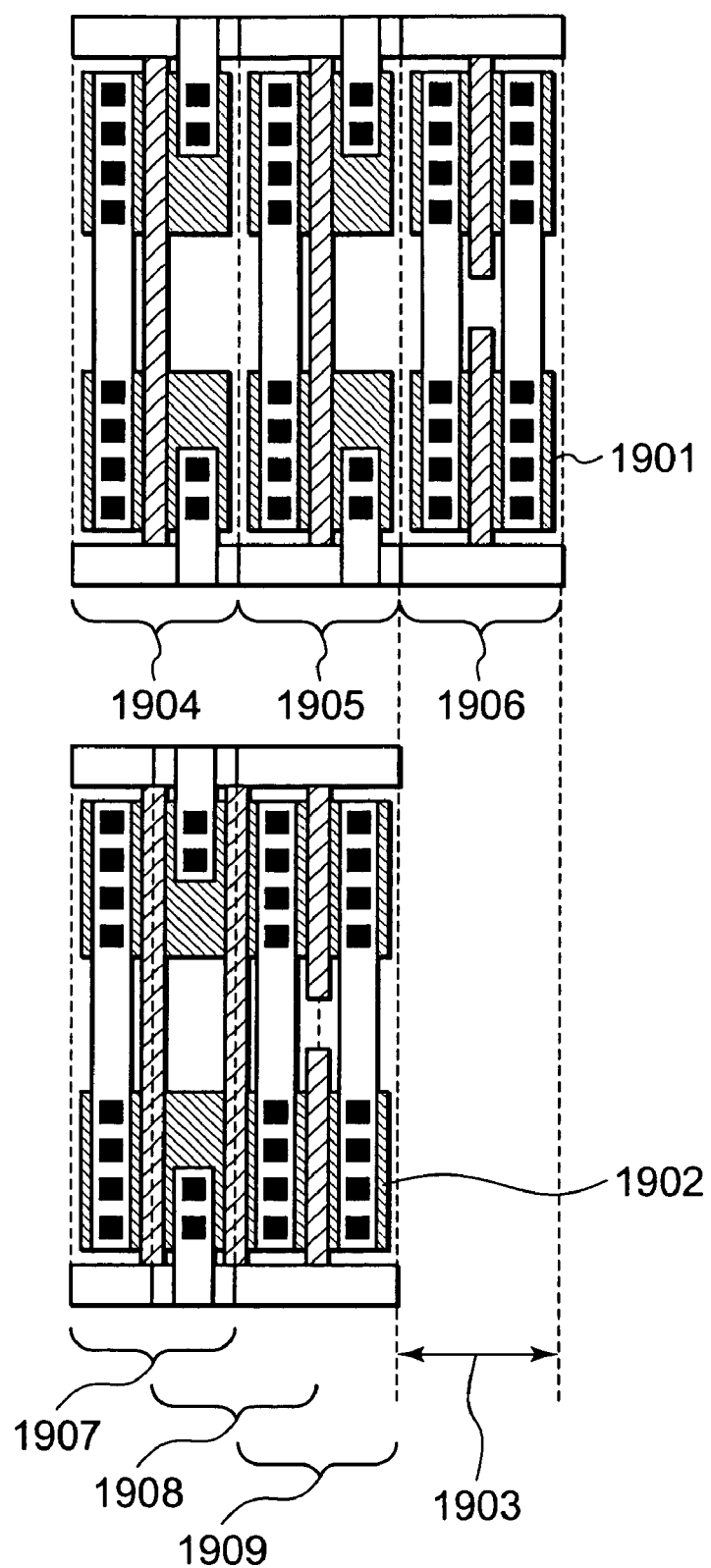
FIG. 19 is a diagram showing the automatic placement of standard cells according to the present invention and the related art.

The result of cell placement according to the related art disclosed in the patent document 1 is indicated at 1901 in FIG. 19. Since the cells are placed in accordance with the circuit shown in FIG. 7, it can be appreciated that inverters 1904 and 1905 correspond to the standard cell 1804 shown in FIG. 18, and a transfer gate 1906 corresponds to the standard cell 1805. Here, although it may be possible to reduce the redundant portion of the right-side edge of the standard cell 1804, sharing does not occur because the edge type differs. It can be appreciated that in the state after the placement of cells as indicated at 1904 and 1905, since the edge type of each of the cells differs from that of the left-side edge of the adjacent cell located on the right, the redundant portion cannot be deleted, so the device placement area is not reduced.

The result of cell placement according to the present invention is indicated at 1902 in FIG. 19. Here, 1908 is placed in a cell orientation that is optimum for sharing of region with 1907, that is, in a left-right inverted orientation in this example. This is due to the processing in step 103 of FIG. 1 constituting a characteristic feature of the present invention. It can be appreciated that as a result of this processing, sharing of region becomes possible, thereby achieving a reduction in device placement area. Further, 1909 also shares part of its cell region with 1908. This is because sharing of region becomes possible through checking of shareability information in the processing of step 104 of FIG. 1 constituting a characteristic feature of the present invention, thereby attaining the effect of reducing the device placement area.

From the foregoing results, it can be appreciated from a comparison of the device placement area between 1901 and 1902 in FIG. 19 that the device placement area according to the present invention is reduced from the device placement area in the case of the placement according to the technique disclosed in the patent document 1 by the amount of the region indicated at 1903, to approximately two-thirds in size.

In the design method for a semiconductor integrated circuit according to the present invention, as a cell library, the layout pattern of a standard cell is split into a plurality of regions, and pin names are added to each of the regions as shareability information. Further, a plurality of standard cells having different pin names for their respective regions are prepared with respect to one circuit. Then, during the automatic placement of standard cells, when the cells are to be placed adjacent to each other, in accordance with the shareability information of a placement candidate cell, the cell is placed in the direction allowing sharing. When the sharing fails, a placement candidate cell is selected again from among the plurality of cells, and after making a determination as to whether sharing is possible, the cell is placed in the direction allowing the sharing. By repeating positive shareability determinations in this way, it is possible to provide a design method and design system for a semiconductor integrated circuit which allow automatic placement that realizes a small device placement area.

While the present invention has been described in the foregoing by way of its preferred embodiment, the present invention is not limited to the above-described embodiment. It is needless to mention that the present invention can be implemented in various modified forms without departing from the gist of the present invention, and that these modifications are also included within the scope of the present invention.

What is claimed is:

1. A method of designing a semiconductor device, comprising:

preparing, by a computer processor, a plurality of cells, each of the cells being configured by splitting a pattern layout of each cell into at least a first side region on a first side of each cell and a second side region on a second side of each cell and by further splitting each of the first and second side regions into first, second and third sub-regions, the first, second and third sub-regions being labeled by respective pin names;

placing, by the computer processor, based on circuit information in which an output of a first cell is connected to an input of a second cell, the first cell and the second cell of the cells adjacently to each other such that the pin names of the first and third sub-regions of the second side region of the first cell are identical respectively to the pin names of the first and third sub-regions of the first side region of the second cell and the pin name of the second sub-region of the second side region of the first cell and the pin name of the second sub-region of the first side region of the second cell are respectively the output of the first cell and the input of the second cell; and sharing, by the computer processor, the first, second and third sub-regions of the second side region of the first cell respectively with the fist, second and third sub-regions of the first side region of the second cell.

2. The method as claimed in claim 1, wherein the first, second and third sub-regions of each of the first and second regions of each of the first and second cells are a PMOS region, an isolation region, and an NMOS region, respectively.

3. The method as claimed in claim 1, further comprising:

placing, by the computer processor, a third cell of the cells adjacently to the second cell on an opposite side to the first cell; and sharing, by the computer processor, the first and third sub-regions of the second side region of the second cell respectively with the first and third sub-regions of the first side region of the third cell.

4. The method as claimed in claim 3, wherein the second region of the second side region of the second cell serves as an output of the second cell and is shared with the second sub-region of the first side region of the third cell serving as an input of the third cell.

5. A method of designing a semiconductor device, comprising:

preparing, by a computer processor, first and second inverter cells, the first inverter cell including first and second P-type regions, a first gate electrode formed between the first and second P-type regions, first and second N-type regions, a second gate electrode formed between the first and second N-type regions, and a first conductive line connecting the first P-type region and the first N-type region to each other with crossing over the first and second gate electrodes, the second inverter cell including third and fourth P-type regions, a third gate electrode formed between the third and fourth P-type regions, third and fourth N-type regions, a fourth gate electrode formed between the third and fourth N-type regions, and a second conductive line connecting the third P-type region and the third N-type region to each other without crossing over the first and second gate electrodes;

locating, by the computer processor, the first and second inverter cells such that the second P-type region and the second N-type region of the first inverter cell are adjacently respectively to the fourth P-type region and the fourth N-type region of the second inverter cell; and sharing, by the computer processor, the second P-type region and the second N-type region of the first inverter cell respectively with the fourth P-type region and the fourth N-type region of the second inverter cell to prove a shared P-type region and a shared N-type region.

6. The method as claimed in claim 5, further comprising connecting the first conductive line to each of the third and fourth gate electrodes of the second inverter cell.

7. The method as claimed in claim 6, further comprising connecting a first power supply line to the shared P-type region and a second power supply line to the shared N-type region.

8. The method as claimed in claim 5, further comprising:
preparing, by the computer processor, a transfer gate cell, the transfer gate cell including fifth and sixth P-type regions, a fifth gate electrode formed between the fifth and sixth P-type regions, fifth and sixth N-type regions, a sixth gate electrode formed between the fifth and sixth N-type regions, a third conductive line connecting the fifth P-type region and the fifth N-type region to each other, and a fourth conductive line connecting the sixth P-type region and the sixth N-type region to each other;
locating, by the computer processor, the transfer gate such that the third P-type region and the third N-type region of the second inverter cell are adjacent respectively to the fifth P-type region and the fifth N-type region of the transfer gate cell; and
connecting, by the computer processor, the second conductive line of the second inverter cell to the third conductive line of the transfer gate cell.

9. The method as claimed in claim 5, further comprising:
preparing, by the computer processor, a transfer gate cell, the transfer gate cell including fifth and sixth P-type regions, a fifth gate electrode formed between the fifth and sixth P-type regions, fifth and sixth N-type regions, a sixth gate electrode formed between the fifth and sixth N-type regions, a third conductive line connecting the fifth P-type region and the fifth N-type region to each other, and a fourth conductive line connecting the sixth P-type region and the sixth N-type region to each other;
locating, by the computer processor, the transfer gate such that the third P-type region and the third N-type region of the second inverter cell are adjacent respectively to the fifth P-type region and the fifth N-type region of the transfer gate cell; and sharing, by the computer processor, the third P-type region and the third N-type region of the second inverter cell respectively with the fifth P-type region and the fifth N-type region of the transfer gate cell.

10. A method of designing a semiconductor device, comprising:
preparing, by a computer processor, a cell library including an inverter cell, the inverter cell including first and second P-type regions, a first gate electrode formed between the first and second P-type regions, first and second N-type regions, a second gate electrode formed between the first and second N-type regions, and a first conductive line connecting the first P-type region and the first N-type region to each other without crossing over the fist and second gate electrodes;
reading, by the computer processor, the inverter cell from the cell library twice to provide first and second inverter cells;
locating, by the computer processor, the first and second inverter cells such that the second P-type region and the second N-type region of the first inverter cell are adjacent respectively to the second P-type region and the second N-type region of the second inverter cell; and
sharing, by the computer processor, the second P-type region and the second N-type region of the first inverter cell respectively with the second P-type region and the second N-type region of the second inverter cell to prove a first shared P-type region and a first shared N-type region.

11. The method as claimed in claim 10, further comprising connecting a first power supply line to the first shared P-type region and a second power supply line to the first shared N-type region.

12. The method as claimed in claim 10, wherein the cell library further includes a transfer gate cell, the transfer gate cell including third and fourth P-type regions, a third gate electrode formed between the third and fourth P-type regions, third and fourth N-type regions, a fourth gate electrode formed between the third and fourth N-type regions, a second conductive line connecting third P-type region and third N-type region to each other, and a third conductive line connecting the fourth P-type region and the fourth N-type region to each other, and the method further comprises:
locating, by the computer processor, the transfer gate cell such that the third P-type region and the third N-type region of the transfer gate cell are adjacent respectively with the first P-type region and the first N-type region of the second inverter cell; and
sharing, by the computer processor, the third P-type region and the third N-type region of the transfer gate cell are adjacent respectively with the first P-type region and the first N-type region of the second inverter cell to prove a second shared P-type region and a second shared N-type region, the second conductive line being thereby connecting the second shared P-type region and the second shared N-type region to each other.

* * * * *